(12) United States Patent
Thomas

(10) Patent No.: US 8,786,318 B2
(45) Date of Patent: Jul. 22, 2014

(54) SYSTEM AND METHODS TO IMPROVE THE PERFORMANCE OF SEMICONDUCTOR BASED SAMPLING SYSTEM

(75) Inventor: David M. Thomas, Colorado Springs, CO (US)

(73) Assignee: Linear Technology Corporation, Milpitas, CA (US)

( * ) Notice: Subject to any disclaimer, the term of this patent is extended or adjusted under 35 U.S.C. 154(b) by 173 days.

(21) Appl. No.: 13/155,993

(22) Filed: Jun. 8, 2011

(65) Prior Publication Data

US 2012/0313670 A1 Dec. 13, 2012

(51) Int. Cl.
*G11C 27/02* (2006.01)

(52) U.S. Cl.
USPC .............................. 327/91; 327/94

(58) Field of Classification Search
USPC .......................................... 327/91, 94
See application file for complete search history.

(56) References Cited

U.S. PATENT DOCUMENTS

| | | | | |
|---|---|---|---|---|
| 4,982,113 A | * | 1/1991 | Jinbo | 326/80 |
| 5,084,634 A | * | 1/1992 | Gorecki | 327/91 |
| 5,170,075 A | | 12/1992 | De Wit | |
| 5,500,612 A | | 3/1996 | Sauer | |
| 5,559,452 A | * | 9/1996 | Saito | 326/88 |
| 5,808,502 A | * | 9/1998 | Hui et al. | 327/333 |
| 6,052,000 A | * | 4/2000 | Nagaraj | 327/94 |
| 6,060,914 A | * | 5/2000 | Nunokawa | 327/91 |
| 6,060,937 A | | 5/2000 | Singer et al. | |
| 6,118,326 A | * | 9/2000 | Singer et al. | 327/390 |
| 6,275,395 B1 | * | 8/2001 | Inn et al. | 363/60 |
| 6,329,848 B1 | | 12/2001 | Maes et al. | |
| 6,404,237 B1 | * | 6/2002 | Mathew et al. | 326/113 |
| 7,215,043 B2 | * | 5/2007 | Tsai et al. | 307/130 |
| 7,388,422 B2 | * | 6/2008 | Khan et al. | 327/536 |

FOREIGN PATENT DOCUMENTS

| | | |
|---|---|---|
| EP | 1821313 A1 | 8/2007 |
| WO | 95/32506 A1 | 11/1995 |

OTHER PUBLICATIONS

A Search Report mailed Apr. 2, 2013, which issued during the prosecution of European Application No. 12171032.1 which corresponds to the present application.

* cited by examiner

*Primary Examiner* — Kenneth B. Wells
(74) *Attorney, Agent, or Firm* — McDermott Will & Emery LLP

(57) ABSTRACT

Circuits and methods that improve the performance of electronic sampling systems are provided. Impedances associated with sampling semiconductor switches are maintained substantially constant during sample states, at least in part, by compensating for encountered input signal variations in order to reduce or minimize signal distortion associated with sampled signals that pass through the sampling switch.

24 Claims, 12 Drawing Sheets

SYSTEM AND METHODS TO IMPROVE THE PERFORMANCE OF SEMICONDUCTOR BASED SAMPLING SYSTEM

CROSS-REFERENCE TO RELATED APPLICATION

This application is related to applications Ser. Nos. 13/155,971, 13/155,922 and 13/155,945, commonly filed with the current application, with common title, inventor and commonly assigned.

TECHNICAL FIELD

The present inventions relate to electronic sampling systems. More particularly, the inventions relate to circuits and methods that improve the performance of electronic sampling systems by reducing signal distortions commonly associated with the electronic implementation of such systems.

BACKGROUND ART

Sampling systems have a wide range of applications in electronics. For example, sampling systems are frequently found in popular consumer electronic devices such as MP3 players, DVD players and cellular telephones. Other popular uses of sampling systems include those related to data acquisition, test and measurement, and control system applications. More specifically, sampling systems and sample-based technology may be found in the electronic components used to construct such devices, which include analog-to-digital converters, switched capacitor networks, signal acquisition circuitry, comparators, and others.

In some applications, sampling systems employ sample and hold circuits that sample a voltage and maintain it in a storage device so that another circuit can measure or otherwise observe the acquired voltage. However, as is known in the art, the mere act of sampling a signal of interest causes a certain amount of distortion to be imparted to the sampled signal.

The signal distortion produced by components in the sampling circuitry tends to limit the useful voltage and frequency range of an input signal. Such distortion may be produced by various factors such as the non-linear resistance characteristics of switches in the sample and hold circuits, effects associated with turnoff thresholds, bulk effect, switch ratio match variations and process variations, etc. Distortion may also be produced by parasitic capacitances of switches in sampling circuits, signal dependent charge injection by switches in the sampling circuits, non-linear load currents flowing through input source resistances, etc.

A typical prior art sample and hold circuit 100 is shown in FIG. 1. Sample and hold circuit 100 generally includes a switch 110, such as a transistor or transmission gate, coupled between an input terminal 115 and a storage device such as sampling capacitor 120. The impedance of switch 110 can be controlled through a switch impedance control terminal 135, which allows switch 110 to function as an "open circuit" (i.e., have a relatively large impedance) when an "OFF" signal is applied to terminal 135, and alternatively, function as a "short circuit" (i.e., have a relatively low impedance) when an "ON" signal is applied to terminal 135.

When switch 110 is, for example, implemented as an N-channel MOS transistor, switch 110 is ON when voltage is applied to its control node, such as a gate, that is above its conductance threshold, and OFF when voltage is applied to its gate that is below its conductance threshold. As is known in the art, the degree to which switch 100 is turned ON or OFF is dependent on the magnitude of the signal applied at its control node. Thus, for example, switch 110 may be turned ON by applying a signal to its control node just above the conductance threshold, but may be turned on harder, improving conductivity characteristics, by applying a greater voltage. Conversely, switch 110 may be turned OFF if the control voltage drops below the conductivity threshold.

In operation, a time varying input signal is applied to input terminal 115. Control circuit 125 is coupled between command terminal 130 and control terminal 135. Control circuit 125 modulates switch impedance between high (OFF) and low (ON) in response to an external hold command signal applied at command node 130.

Sample and hold circuit 100 has two distinct states usually referred to as a sample state and a hold state. In the sample state, switch 110 is ON (i.e., presents a low impedance between input terminal 115 and sampling capacitor 120) thus forcing the signal on the sampling capacitor 120 to follow the input signal. In the hold state, switch 110 is "OFF" (i.e., presents a high impedance between input terminal 115 and sampling capacitor 120), thus the signal on capacitor 120 is maintained at its previous level and is substantially independent of the input signal.

As is known in the art, switch 110 can be implemented using various electronic and electro-mechanical components including, but not limited to, relays, armature switches, and transistors in various forms, including bipolar junction transistors (BJTs), field effect transistors (FETs), etc.

However, known sample and hold circuits, similar to those described above, suffer from various drawbacks and disadvantages. For example, because of certain properties associated with physical component implementations, switch impedance in the sample state is often not low enough for optimal signal transmission or may vary with the magnitude of the input signal. This may occur, at least in part, because the signal applied to the control node of switch 110 does not turn the transistor ON hard enough or its relation with respect to the device conduction threshold varies due to changes in the magnitude of the input signal.

The resulting undesired effect in the sample state is that the voltage signal stored on capacitor 120 will be different from the input signal applied at input terminal 115. Furthermore the difference between the voltage signal stored on capacitor 120 and the input signal may be a function of the instantaneous value of the input signal. Thus, the signal acquired during the hold state will be an imprecise representation of the input signal, and any subsequent signal processing blocks will be affected by these imprecisions. Such signal distortion becomes increasingly significant as the maximum frequency of the input signal increases and its magnitude becomes comparable with an available power supply range.

The performance of high speed sampling data systems such as analog-to-digital converters is sensitive to variations in time intervals between successive sample operations. This variation may be referred to as a sampling jitter. A component of the sampling jitter is the variation in the time delay from the moment the external hold command is asserted at command terminal 130 to the moment switch 110 enters its hold state (i.e., is OFF). Control circuit 125 typically requires a finite time interval to produce the control signal which will modulate the switch impedance from its sample value to its hold value. If the threshold at which this transition occurs is dependent upon the input signal, the result is sampling jitter. Accordingly, it is generally desirable to minimize the effect of the input signal upon the switch control signal transition threshold.

In an effort to overcome the drawback of sampling jitter, sampling switches are constructed using CMOS transmission gates. Using this implementation, however, with an input signal range comparable to the available power supply, the equivalent switch impedance variation during the sample state becomes significant and introduces increasing amount of distortion as the input signal frequency increases.

An early attempt to solve this problem is described in U.S. Pat. No. 5,170,075 to de Wit. As shown in FIG. 2, which is a general representation of the circuit proposed by de Wit, an input signal 215 is connected directly to a control circuit 225, and coupled to a sampling capacitor 220 through a switch 210. Said switch 210 is constructed using a MOSFET device. Control circuit 225 controls switch impedance via control terminal 235 in response to an external HOLD signal 230 and uses a set of boost capacitors (not shown) coupled to develop a pre-selected voltage, $V_P$, which in the sample state, is superimposed upon the input voltage. The resulting compound voltage is used to control the switch impedance during the sample state. As a result, in the sample state, switch 210 is controlled using a fixed gate-to-channel voltage, which reduces the switch impedance variation with input signal. In addition, the transition threshold between the sample and hold states is determined by the magnitude of $V_P$ and is substantially independent from the input voltage.

Other attempts to overcome the disadvantages associated with known sampling circuits are presented in U.S. Pat. Nos. 5,500,612 and 6,118,326. The circuits described therein include significant circuitry coupled through additional switches to a sensitive input terminal. One undesirable consequence of these proposed configurations is an increase in signal dependent loading at the input as well as undesirable kick-back signals during the transition between the sample and the hold states. The additional signal dependent loading may translate into increased signal distortions due to the finite impedance of the external input signal driver.

Moreover, kick-back signals appear (due in part to various impedances present in real implementation) when the pre-selected $V_P$ voltage is superimposed upon the input signal. These signals present more difficult settling requirements for the external input signal driver thus increasing power consumption and cost. In addition, while the gate-to-channel voltage characteristics are somewhat improved, the channel-to-body potential still changes with the varying input signal. Consequently, the switch impedance during the sample state continues to vary due to the switch device body effect. Similarly, the transition threshold is also dependent upon the switch device body effect.

Another attempt to overcome the disadvantages associated with known sampling circuits is presented in U.S. Pat. No. 6,329,848 to Maes et al., which employs certain known isolation techniques to reduced loading at the input. More specifically, as shown in FIG. 3, which is a general representation of the circuit proposed by Maes et al., a dedicated buffer amplifier 345 is used to isolate a control circuit 325 from an input terminal 315. A switch 310 is implemented using a MOSFET device with its source and drain terminals coupled to the input terminal 315 and a sampling capacitor 320. A gate terminal 335 and a body terminal 340 are both driven by the control circuit 325.

The circuit of FIG. 3 separately controls gate-to-channel and channel-to-body voltages as a function of the input signal as reproduced by buffer 345 to reduce switch impedance variations during the sample state. In addition, the buffer amplifier 345 tends to reduce the undesirable loading of the input terminal. This approach, however, continues to suffer from various drawbacks. For example, despite some reduction in loading compared with other implementations, this implementation still adds some loading at the input terminal, imparting a certain amount of distortion on the input signal. Moreover, it requires the use of a dedicated buffer amplifier with good settling characteristics and negligible group delay, which is relatively expensive to produce.

Thus, in view of the foregoing, it would be desirable to provide circuitry and methods that improve the performance of electronic sampling systems by reducing signal distortions commonly associated with the physical implementations of such circuits.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE EMBODIMENTS

Figure 3:
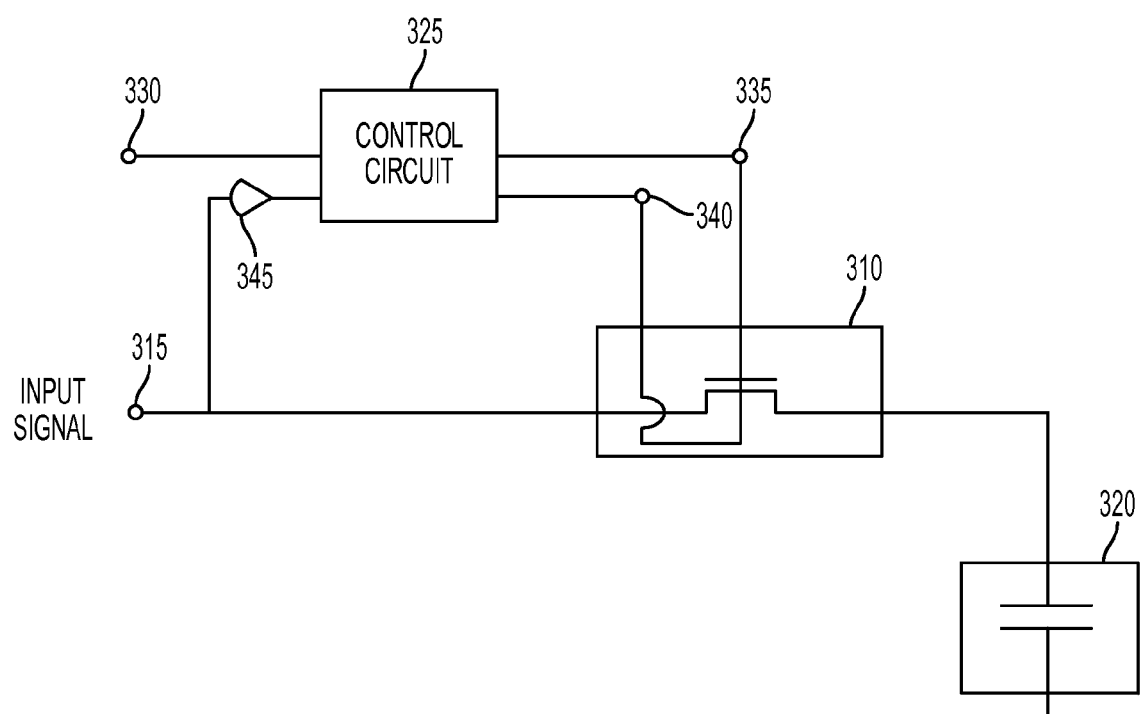
FIG. 3 is a schematic diagram of another prior art sample and hold circuit.
Figure 4:
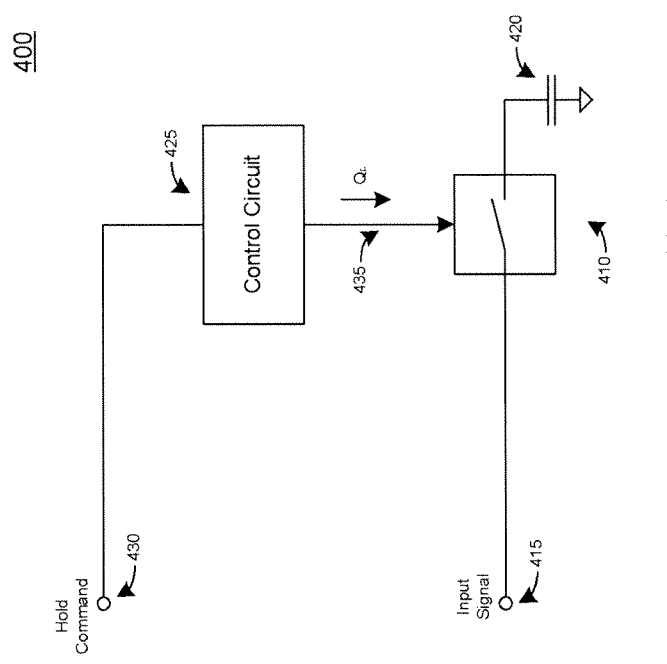
FIG. 4 is a generalized schematic diagram of one embodiment of a sample and hold circuit constructed in accordance with the principles of the present invention.

A sampling circuit 400, constructed in accordance with the principles of the present invention, is shown in FIG. 4. As in FIG. 3, the sampling circuit of FIG. 4 generally includes a control circuit 425, a sampling switch 410, a capacitor or other suitable storage component 420, a command node 430, a switch control terminal 435, and an input terminal 415. In this example, the storage component 420 is a capacitor (although other suitable storage component may be used if desired).

Figure 1:
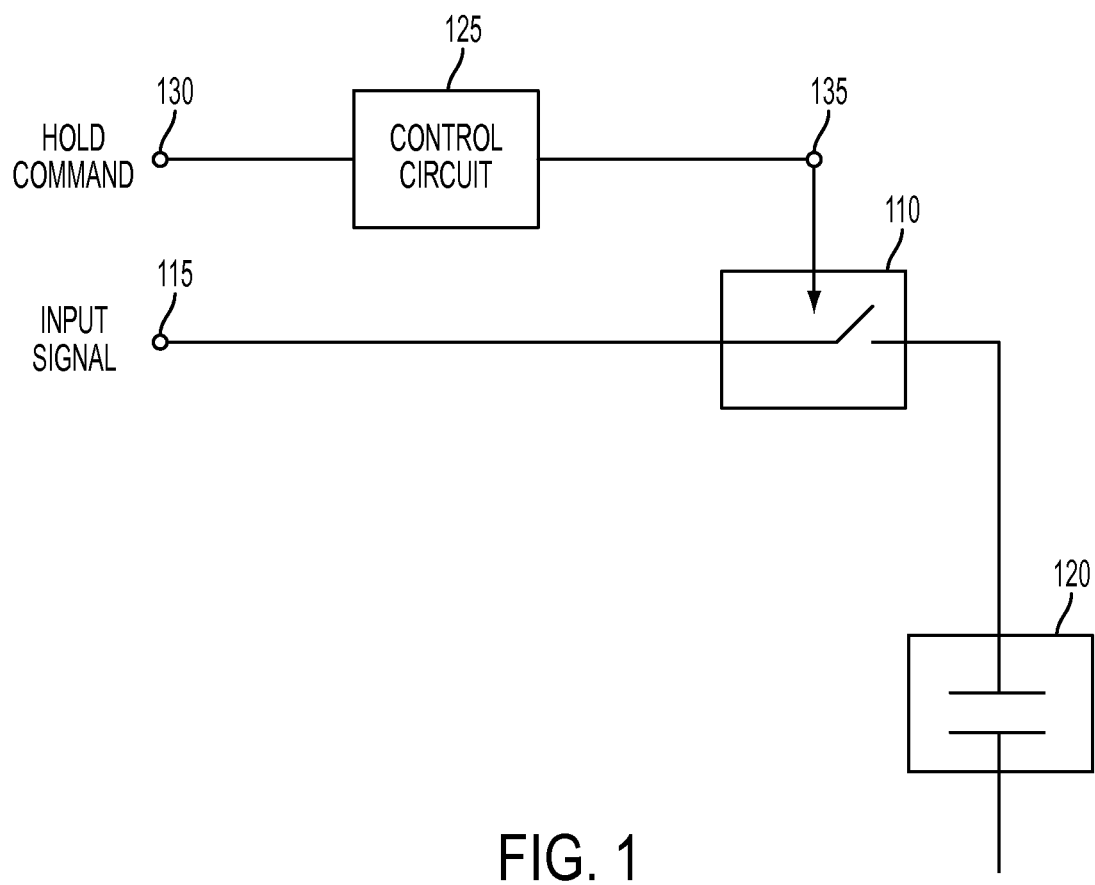
FIG. 1 is a schematic diagram of a prior art sample and hold circuit.
Figure 2:
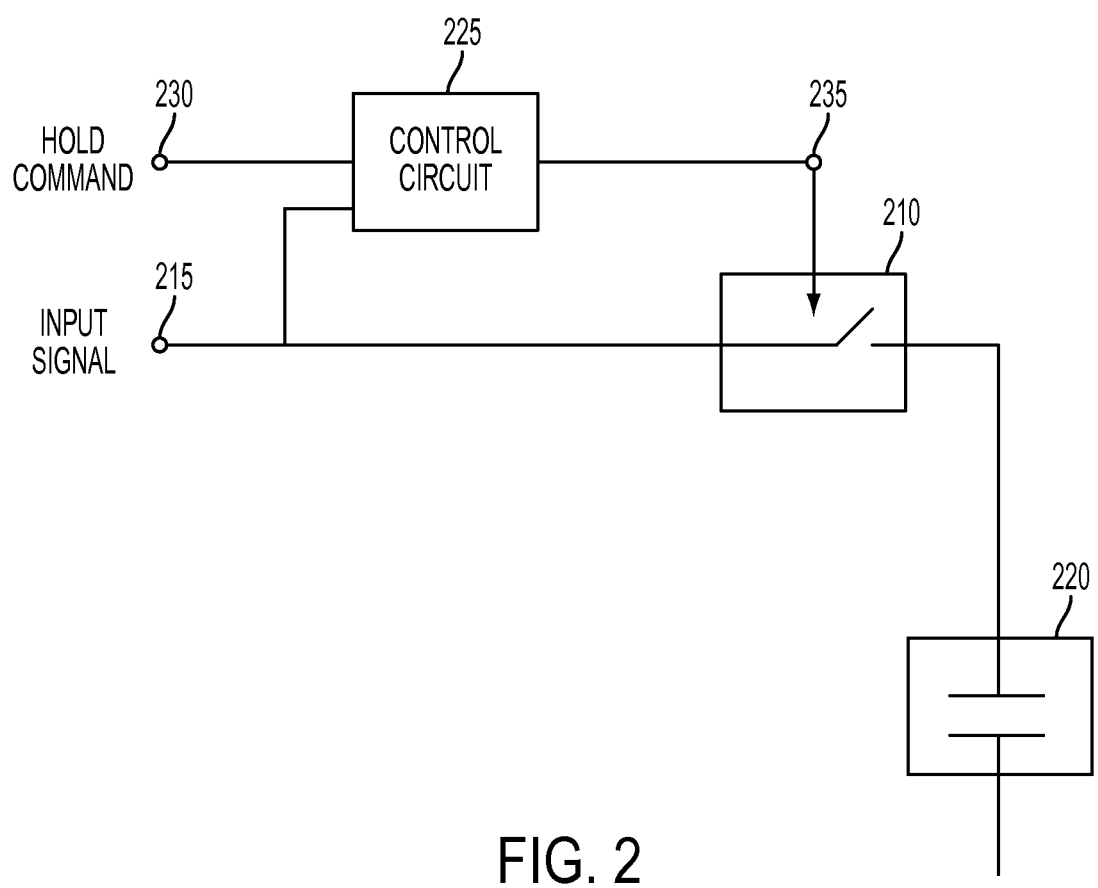
FIG. 2 is a schematic diagram of another prior art sample and hold circuit.

One way in which sampling circuit 400 has been improved as compared to the sampling circuits shown in FIGS. 1-3, is by substantially reducing or eliminating all additional circuitry connected to the sensitive input terminal 415. In some embodiments, such remaining circuitry coupled to the input terminal may be disconnected during the sampling mode when its presence is most disadvantageous (discussed further below). As FIG. 4 shows, control circuit 425 is coupled between command node 430 and control terminal 435 of sampling switch 410.

FIG. 4 also shows that sampling switch 410 is coupled between input terminal 415 and capacitor 420. The impedance of switch 410 is controlled by control circuit 425, as determined by the external HOLD signal applied at the command node 430.

Similar to the prior art circuits illustrated in FIGS. 1-3, circuit 400 may operate in at least two different modes, sample mode and hold mode. In the sample mode, the impedance of sampling switch 410 is low, and thus the input signal at node 415 is typically applied to capacitor 420. In the sample mode, circuit 400 may operate as follows. An input signal may be applied to input terminal 415. A command signal, such as a HOLD signal, may then be applied (or toggled) at command node 430 causing the signal on control terminal 435 to turn sampling switch 410 ON.

Generally, a predefined charge, $Q_P$ is developed by control circuit 425, and is applied to sampling switch 410. This predefined charge develops a substantially constant gate-to-source control voltage for sampling switch 410, such that its impedance is maintained at a substantially constant level, which may be predetermined based on the turn ON characteristics of switch 410. For the purposes of illustration, assume $Q_P$ is selected such that the impedance of the transmission path in sampling switch 410 is and remains minimized with respect to the input signal (i.e., substantially constant). This arrangement allows the input signal at terminal 415 to charge capacitor 420 to its value without suffering from distortion associated with varying switch impedance.

In some embodiments, the HOLD command may be provided such that circuit 400 is maintained either in a sample or a hold state and merely toggles between the two. For example, the HOLD command may be either a logic high or logic low signal from an internal or an external source, placing the circuit 400 in one of the two modes. This may be done in order to prevent command node 430 from "floating" which may place circuit 400 in an indeterminate state.

Moreover, in some embodiments, predefined charge $Q_P$ may be selected in view of the turn ON characteristics of sampling switch 410 such that the circuit designer's desired switch impedance is substantially achieved and maintained, even with respect to a varying input signal. For example, a value of $Q_P$ may be selected in order to minimize switch impedance in view of the input signal while in sample mode and thereby minimize or eliminate any distortion on the acquired input signal.

In other embodiments, control circuit 425 may also include known circuitry (not shown) for adjusting $Q_P$ to account for manufacturing variations in switch characteristics or to account for changes due to component age, temperature variation, power supply variations, etc.

When sampling switch 410 is turned ON, the signal at input terminal 415 is applied to capacitor 420, which stores a value representative of the signal's magnitude. In traditional sample and hold circuits, capacitor 420 stores the magnitude of any input signal in the form of charge collected on the upper capacitor plate. The voltage stored thereon may be subsequently measured or otherwise observed and processed as desired.

In preferred embodiments, the duration of the sampling period is of sufficient time to allow for settling and ensure proper acquisition of the input signal. However, as will be understood from above, sampling switch 410 may remain ON as long as the HOLD signal directs it to do so. In such embodiments, the duration of the sampling period may be controlled by the HOLD signal. In other embodiments, a sample state may be maintained by a voltage stored on a certain capacitance associated with switch 410, which may remain until control terminal 435 is discharged when transitioning to a hold state.

As shown, the input terminal is preferably not connected to any circuitry responsible for toggling sampling switch 410 ON and OFF during the sampling mode. As a result, the input signal at node 415 does not experience any undesirable loading associated with circuitry in circuit 400 (other than that associated with capacitor 420 and switch 410), thereby reducing signal distortion. Moreover, the channel impedance of sampling switch 410 is maintained substantially constant by the predefined charge $Q_P$ allowing the input signal to pass substantially unaltered, further improving the quality of the sample obtained by capacitor 420.

After a sample has been obtained, circuit 400 may toggle from the sampling mode to the hold mode. One way this may be accomplished is by inverting the HOLD signal applied at command node 430. This may involve changing the HOLD signal from logic high to logic low or vice versa depending on the specific implementation of circuit components in circuit 400.

Choosing one convention for the purpose of illustration, assume that the HOLD signal changes from logic low (the sample mode) to logic high (the hold mode). When this occurs, switch 410 is turned OFF such that the input signal is disconnected from capacitor 420. When this occurs, control circuit 425 may discharge the gate of switch 410 and connect the gate to ground or other suitable OFF state control level. This turns switch 410 OFF, disconnecting it from the input signal at node 415, and thus isolating capacitor 420 from the input signal, placing circuit 400 in hold mode.

Figure 5:
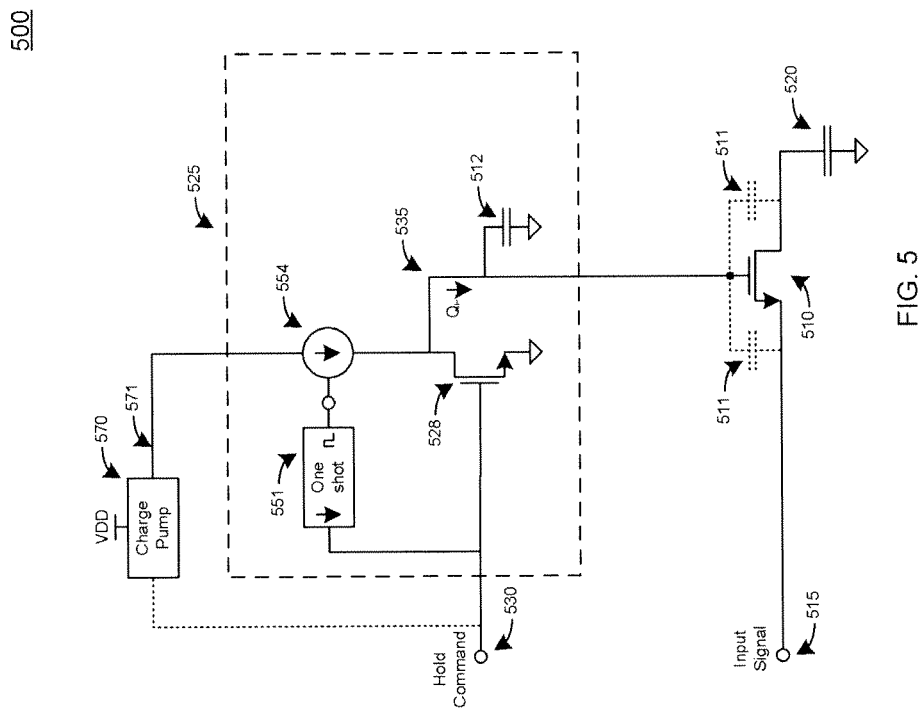
FIG. 5 is a schematic diagram of another embodiment of a sample and hold circuit constructed in accordance with the principles of the present invention.

Referring now to FIG. 5, one possible implementation 500, constructed in accordance with the principles of the present invention, is shown. Circuit 500 is similar in certain respects to the circuit described in FIG. 4, and generally includes components and functional blocks which have been numbered similarly to denote similar functionality and general correspondence. For example, circuit 500 includes a storage capacitor 520 (capacitor 420 in FIG. 4), an input terminal 515 (input terminal 415 in FIG. 4), a sampling switch 510 (sampling switch 410 in FIG. 4), a control circuit 525 (control circuit 425 in FIG. 4) and a command node 530 (command node 430 in FIG. 4).

As shown, circuit 500 may include if necessary a charge pump 570 discussed below. The control circuit 525 may include a controlled current source 554, a switch 528 and a timing circuit 551. In this example, switch 528 may be a MOSFET transistor, a transmission gate or other suitable semiconductor device. Also as shown in this embodiment, timing circuit 551 may be a one-shot circuit, however, any other suitable timing circuit such as a latch, flip-flop, comparator, transient network, clock, or combination thereof may be used, if desired. The timing circuit 551 is triggered by a high-to-low signal transition at its control input.

Similar to circuit 400 of FIG. 4, circuit 500 may operate in at least two modes, a sample mode and a hold mode. Thus, circuit 500 may operate as follows. A logic high signal may be applied to command node 530. This signal turns switch 528 ON thus discharging the control node 535 and turning switch 510 OFF. This disconnects the input signal at node 515 from capacitor 520, isolating capacitor 520 and placing circuit 500 in a hold state.

To transition from a hold to a sample state, the HOLD signal at command node 530 is toggled from logic high to logic low. This turns switch 528 OFF, and causes the one-shot circuit 551 to generate a timing pulse (e.g., a relatively short duration logic high or logic low signal produced upon detecting a logic high-to-low transition at the trigger input) turning current source 554 ON for the duration $T_p$. When ON, controlled current source 554 generates an output current $I_p$.

Thus, a predefined charge $Q_p = I_p * T_p$ is applied to the gate of switch 510. This causes the voltage at the gate to rise, tending to turn switch 510 ON, which transitions circuit 500 from the hold state to the sample state.

As is known in the art, when the voltage at the gate of switch 510 rises above its turn ON threshold (with respect to channel potential) a gate to channel capacitance 511 (depicted as dotted lined capacitors) associated with the MOSFET switch 510 begins to develop. Generally speaking, while operating in this region, the gate of MOSFET switch 510 acts as a non-linear capacitor, with gate to channel capacitance 511 increasing as the voltage differential between the gate and channel becomes greater. Capacitance 512 (representing parasitic capacitance which may also be present at control node 535) absorbs some of the charge provided by current source 554, which undesirably causes the impedance of switch 510 to vary.

The amount of gate to channel capacitance 511 associated with MOSFET switch 510, however, can be determined, based on factors such as fabrication materials and process type, size and shape, etc., and thus taken into account (compensated for) in selecting the value of time interval $T_p$ or output current $I_p$ or both. Therefore, the amount of charge required by MOSFET switch 510 to fully turn ON can be calculated as the charge value $Q_p$ necessary to create a full turn ON voltage $V_{ON}$ between the gate and source of switch 510. In some embodiments, any parasitic capacitance 512 may also be included in the calculation to obtain a very high precision value for $V_{ON}$. In specific implementations, the parasitic value may vary based on certain factors including circuit layout, material specifics, and any ancillary capacitive junctions.

By providing the appropriate amount of charge to control path 535 when turning MOSFET switch 510 ON, it is possible to substantially reduce or eliminate signal distortion associated with varying switch impedance encountered while circuit 500 is in the sample mode. This objective may be achieved by ensuring that the amount of charge delivered by current source 554 is substantially equal to the charge absorbed by gate to channel capacitance 511 (referred to as $Q_P$) and parasitic capacitance 512 when a voltage $V_{ON}$ is developed between gate and source of MOSFET switch 510.

Accordingly, one way this may be accomplished is by determining the amount of instantaneous current produced by current source 554 ($I_p$) and multiplying that value by the time period ($T_p$) of the pulse generated by timing circuit 551 to obtain a total charge value ($Q_p$). Once the charge value has been obtained, either the time period of the pulse ($T_p$), or the value of current source 554 (or both) may be adjusted to ensure that $Q_p$ is applied to the gate of MOSFET switch 510 to obtain substantially constant switch impedance during sample state. This adjustment may be made at design time taking into account the expected properties of switch 510 and value of parasitic capacitance 512 or may be made at fabrication time (using well known trimming techniques) or may be made during circuit 500 operation (using well known tracking techniques such as replica and or ratio circuit monitors) or any combinations of the above. For example the timing circuit 551 may adjust the duration $T_P$ of the timing pulse by monitoring the gate capacitance and parasitic capacitance of a device which substantially replicates the properties of switch 510 and/or control terminal 585.

Once current source 554 turns OFF, the voltage imparted to control terminal 535 will remain substantially constant with respect to the input signal (until the HOLD signal toggles again, and the stored energy is dissipated through switch 528).

Furthermore, in certain circumstances, the associated voltage applied to the gate of transistor 510 during the sampling period may need to be greater than the rail voltage $V_{DD}$ in order to accommodate a wider range of input signals. One way this may be accomplished is by employing a charge pump or other voltage multiplier circuit known in the art to charge certain energy storage elements in circuit 500. For example, as shown in FIG. 5, charge pump 570 may be coupled to current source 554. In some embodiments, charge pump 570 (which may include one or more capacitors charged to suitable voltages and connected in successive series and parallel configurations to increase their overall voltage) may be coupled to command node 530. Thus, when a pulse from timing circuit 551 is received by current source 554, it may turn ON, establishing a current path through it (and/or charge pump 570) which conducts stored energy to the gate of switch 510, turning it ON. This arrangement allows switch 510 to be turned ON quickly and with enough energy to maintain the impedance of MOSFET switch 510 at the desired level (e.g., substantially constant) for a wide range of input signal levels.

Within this implementation, the size and capacity of energy storage devices in charge pump 570 may be calculated so they provide at least an appropriate $Q_P$ value to turn MOSFET switch 510 fully ON substantially instantaneously, such that switch impedance is and is maintained substantially constant, which, in some embodiments may be a minimum switch impedance, improving the accuracy of sampling circuit 500.

It will be understood that, depending upon the magnitude of the desired input signal range, the magnitude of the available power supply VDD, the characteristics of the semiconductor devices utilized, the desired sampling frequency and sampling settling time (and other similar factors), charge pump 570 may or may not be necessary in sampling circuit 500. Furthermore, when present, charge pump 570 may operate continuously, independent of the state (sample or hold) of sampling circuit 500 or operate on demand, as directed by HOLD command signal 530 (and as indicated by the dotted line connection of FIG. 5).

Figure 6:
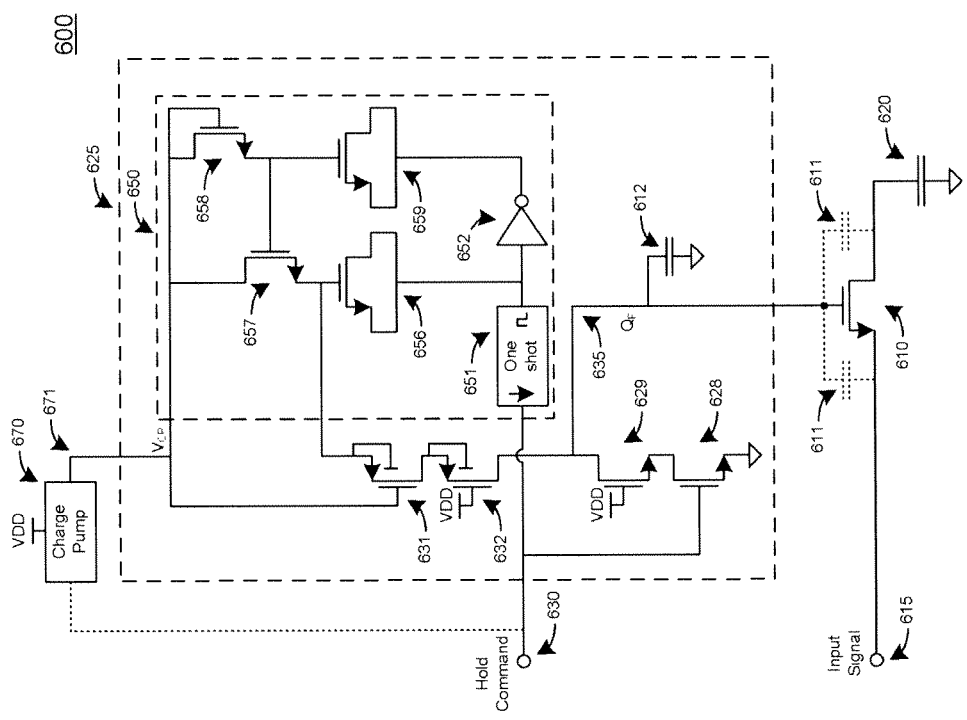
FIG. 6 is a more detailed schematic diagram of another embodiment of a sample and hold circuit constructed in accordance with the principles of the present invention.

Referring now to FIG. 6, another possible specific implementation 600, constructed in accordance with the principles of the present invention, is shown. Like circuit 400, circuit 600 also is similar in certain respects to the circuit described in FIG. 4 and generally includes components and functional blocks which have been numbered similarly to denote similar functionality and general correspondence. For example, circuit 600 includes command node 630 (command node 430 in FIG. 4), control node 635 (control node 435 in FIG. 4), sampling switch 610 (sampling switch 410 in FIG. 4), control circuit 625 (control circuit 425 in FIG. 4) and capacitor 620 (capacitor 420 in FIG. 4), etc.

As shown, control circuit 625 may include charge transfer switch 631, discharge switch 628 and charge generator 650. Additional devices 629 and 632 limit the voltage across switches 628 and 631 respectively and may or may not be included, depending on the operating range of these devices (628 and 631). Charge generation circuit 650 may include transistors 656, 657, 658 and 659, inverter 652, and a timing circuit 651. In this example, the timing circuit 651 may be a one-shot circuit but other well known circuits such as flip-flops, logic gates, transistors and so on may be used if desired to implement the timing sequence described below. The timing circuit 651 is triggered by a high-to-low signal transition at its control input. A voltage level $V_{CP}$ present on rail 671 may be provided by another power source or (as shown in FIG. 6) by charge pump 670 functionally similar to charge pump 570 in FIG. 5.

As above, circuit 600 operates in at least two modes, a sample mode and a hold mode and may operate as follows. A logic high signal may be applied to the input of command node 630. This signal is preferably of sufficient magnitude to turn transistor 628 ON, which discharges control node 635 and the gate of switch 610, turning switch 610 OFF. This disconnects the input signal at node 615 from capacitor 620, isolating capacitor 620 and placing circuit 600 in a hold state.

The output of one shot circuit 651 in the hold mode is a logic low (close to ground), which causes the output of inverter 652 to be a logic high (close to VDD), driving the gate of switch 657 high (through capacitor connected transistor 659). This turns switch 657 ON, allowing capacitor connected transistor 656 to be charged close to the potential $V_{CP}$ of rail 671. The drain-to-gate voltage across device 631 is near zero maintaining switch 631 in the OFF state.

To transition from a hold to a sample state, the HOLD signal at command node 630 may be toggled from logic high to a logic low. This turns transistor 628 OFF, and causes timing circuit 651 to generate a short logic high pulse (e.g., a relatively short duration logic high signal produced upon detecting a logic high-to-low transition at the trigger input) which causes a short logic low pulse at the output of inverter 652. This allows capacitor connected transistor 656 to discharge through switch 631 and transistor 632, thus providing its stored charge to switch 610 via control terminal 635, turning switch 610 ON.

The amount of charge provided to switch 610 can be specified by a circuit designer by controlling the size ratio of capacitor connected transistor 656 and switch 610. For example, it may be desired to provide a calculated $Q_P$ value of charge to the gate of switch 610 which takes into account its gate to channel capacitance (shown as capacitors 611 in FIG. 6) and any parasitic capacitance encountered by charge traveling from capacitor 656 to the gate of switch 610 (represented by capacitor 612 in FIG. 6). When transferred to control terminal 635 the charge $Q_P$ generates an ON voltage $V_{ON}$ from the gate to the source of sampling switch 610 thus setting its sample mode impedance. Once the $Q_P$ value desired for switch 610 is calculated, the size of capacitor connected device 656 may be selected to provide it such that the impedance of switch 610 is minimized and maintained substantially constant. As an example, the physical implementation of device 656 may replicate or ratio the physical implementation of device 610, of its command node 635 and of its associated parasitic circuit elements.

It will be understood that although sampling circuit 600 may be used with a $Q_P$ value that minimizes the impedance of switch 610, that other values may be used to obtain any suitable substantially constant impedance desired (whether minimized or not). The timing pulse produced by circuit 651 should be selected such as to allow the transfer of the desired charge $Q_P$ to control terminal 635.

Because the magnitude or duration of the current pulse (thus the magnitude of the charge) provided by transistor connected capacitor 656 is not influenced by the voltage at the input terminal 615, the gate of sampling switch 610 will acquire a gate charge that is substantially independent from the voltage at input terminal 615, thus improving the precision of a sample obtained by capacitor 620.

Moreover, when the current pulse is OFF, at the end of the timing circuit 651 pulse, the voltage at the gate of sampling switch 610 with respect to the signal path will remain substantially fixed and independent of the input voltage. Thus, switch 610 is controlled without adding any additional circuitry connected to the sensitive input terminal 615 during sampling mode.

In some implementations of circuit 600, parasitic capacitance 612 associated with control terminal 635 may cause the ON impedance of MOSFET 610 to vary slightly as function of the input signal applied to input node 610. This variation typically occurs at the instant MOSFET 610 is turned ON. When the control terminal 635 settles as desired at a voltage $V_{ON}$ above the input voltage (applied at input terminal 615) the parasitic capacitance 612 must be charged to the same level directly dependent of the input voltage. Thus the parasitic capacitance 612 absorbs a fraction of the charge $Q_P$ which varies with the input voltage causing a variation in $V_{ON}$ final value. For example, if an input signal of two volts is initially applied to input node 615 (i.e., the source of MOSFET 610) prior to turning it ON, the charge at the gate of MOSFET 610 will be offset by the two volt source potential. This offset alters the turn ON level of MOSFET 610 (by the amount of charge absorbed by parasitic capacitor 612) and thus alters its impedance, which may undesirably impart distortion to any sampled signal. Because this offset will vary as a function of the input signal, the impedance of MOSFET 610 may also vary with respect to the input signal.

One way to address this problem is to provide a preset gate to source initialization voltage to MOSFET 610 (and implicitly to the parasitic capacitor 612) prior to providing the turn ON charge through switch 631. Such an initialization voltage may be derived from the input signal and applied to the gate of MOSFET 610 at the beginning of the sample mode but prior to signal acquisition (so it does not affect the input signal during acquisition). This allows the gate of MOSFET 610 to include an initialization voltage similar to (or the same as) that of the subsequently sampled signal to either fully or partially offset any gate to source voltage differential, and minimize instantaneous impedance variation, thereby improving the precision of the sampled signal.

Figure 7:
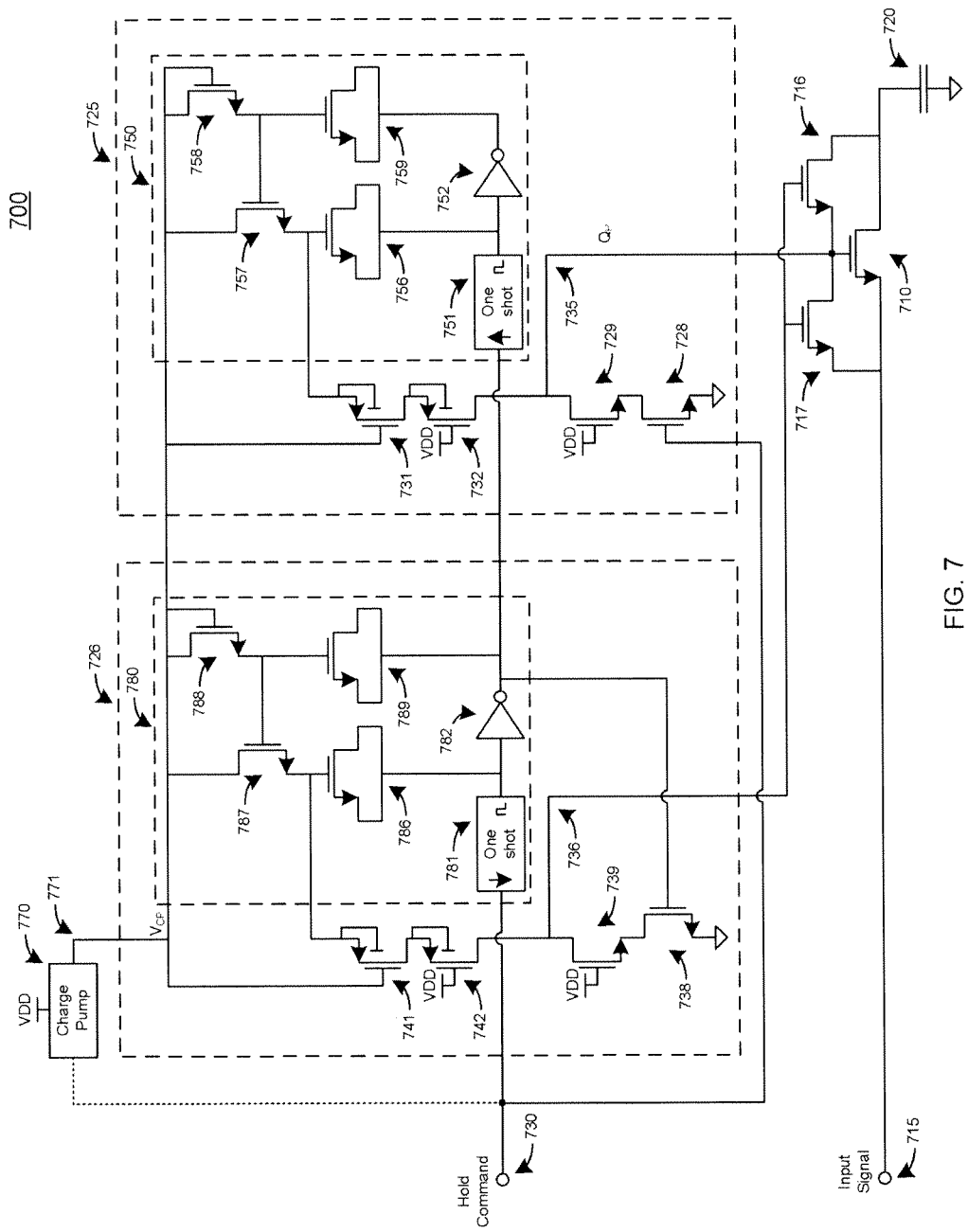
FIG. 7 is a more detailed schematic diagram of another embodiment of a sample and hold circuit constructed in accordance with the principles of the present invention.

One preferred embodiment of such a circuit is shown in FIG. 7 as circuit 700. Circuit 700 is similar in many respects to the circuit described in FIG. 6 and generally includes components and functional blocks which have been numbered similarly to denote similar functionality and general correspondence. For example, circuit 700 includes control circuit 725 (control circuit 625 in FIG. 6), charge generator circuit 750 (charge generator circuit 650 in FIG. 6) sampling switch 710 (sampling switch 610 in FIG. 6), and capacitor 720 (capacitor 620 in FIG. 6), charge pump circuit 770 (charge pump circuit 670 in FIG. 6) etc.

However, circuit 700 further includes gate initialization transistors 716 and 717, which are controlled by initialization control circuit 726 and an initialization charge generator circuit 780 (discussed in detail below).

As shown, control circuit 725 may include charge transfer switch 731, discharge switch 728 and charge generator 750. Additional devices 729 and 732 limit the voltage across switches 728 and 731 respectively and may or may not be included, depending on the operating range of these devices (728 and 731). Charge generation circuit 750 may include transistors 756, 757, 758 and 759, inverter 752 and a timing circuit 751. The timing circuit 751 is triggered by a low-to-high signal transition at its control input. Control circuit 725 and charge generator circuit 750 may operate the same as or similar to circuits 625 and 650 described above.

Circuit 700 further includes initialization control circuit 726 and initialization charge generation circuit 780. As shown, initialization control circuit 726 may include charge transfer switch 741, discharge switch 738 and charge generator 780. Additional devices 739 and 742 limit the voltage across switches 738 and 741 respectively and may or may not be included, depending on the operating range of these devices (738 and 741). Initialization charge generation circuit 780 may include transistors 787 and 788, capacitor coupled transistors 786 and 789, inverter 782, and a timing circuit 781. The timing circuit 781 is triggered by a high-to-low signal transition at its control input. Circuits 726 and 780 may operate the same as or similar to circuits 725 and 750 described above except that they generate signals at different times (e.g., circuits 725 and 750 provide an ON signal to MOSFET 710 during the sample mode when an input signal is being acquired by sampling capacitor 720 whereas circuits 726 and 780 provide an initialization signal to transistors 716 and 717 prior to acquiring the input signal to minimize or eliminate instantaneous impedance variation described above. In some embodiments, the initialization signal may be provided as an initial part of the sample mode as described below or, as an alternative, during the hold mode.

As above, circuit 700 operates in at least two modes, a sample mode and a hold mode and may operate as follows. A logic high signal may be applied to the input of command node 730. This signal is preferably of sufficient magnitude to turn transistor 728 ON, which discharges control node 735 and the gate of switch 710, turning switch 710 OFF. This disconnects the input signal at node 715 from capacitor 720, isolating capacitor 720 and placing circuit 700 in a hold state.

The output of one shot circuit 781 in hold mode is a logic low (close to ground), which causes the output of inverter 782 to be a logic high (close to VDD), driving the gate of switch 787 high (through capacitor connected transistor 789). This turns transistor 787 ON, allowing capacitor connected transistor 786 and the source of transistor to be charged to the potential $V_{CP}$ of rail 771 (which may be the elevated voltage created by charge pump 770).

Similarly, in circuit 750, the output of one shot 751 in hold mode is a logic low (close to ground), which causes the output of inverter 752 to be a logic high (close to VDD), driving the gate of switch 757 high (through capacitor connected transistor 759). This turns switch 757 ON, allowing capacitor connected transistor 756 to be charged to the potential $V_{CP}$ of rail 771 (which is the elevated voltage created by charge pump 770). The logic high signal generated by inverter 782 in hold mode turns switch 738 ON discharging the gates of initialization transistors 716 and 717, turning them OFF.

When circuit 700 transitions from a hold to a sample state, the HOLD signal at command node 730 may be toggled from logic high to logic low. This turns transistor 728 OFF and triggers the initialization control circuit 726 in an initial part of the sample state. This causes the timing circuit 781 to generate a short logic high pulse (e.g., a relatively short duration logic high signal produced upon detecting a logic high-to-low transition at the trigger input) which causes a short logic low pulse at the output of inverter 782. This allows capacitor connected transistor 786 to discharge through switch 741 and transistor 742, thus providing its stored charge to the gates of initialization transistors 716 and 717, which turns them ON. As a result, the gate of MOSFET 710 is charged to a value tracking the input signal at node 715. The impedance of initialization devices 716 and 717 may be controlled by selecting the ratio between them and the capacitive coupled device 786.

After a predetermined period of time, the output of one-shot 781 returns to a logic low, which turns transistor 738 ON (through inverter 782). This discharges the gate of initialization transistors 716 and 717 which turns them OFF, but maintains the initialization charge at the gate of MOSFET 710.

Accordingly, at this moment in the signal acquisition process the gate of MOSFET 710 includes the initialization charge which partially or fully offsets any gate to source voltage differential, minimizing (or substantially eliminating) any instantaneous impedance variation, thereby improving the precision of the acquired signal.

At the completion of the initialization circuit 726 operation the output of inverter 782 returns to a logic high state creating a rising edge trigger input for circuit 751, prompting one shot circuit 751 to generate a short logic high pulse (e.g., a relatively short duration logic high signal produced upon detecting a logic low-to-high transition at the trigger input) which causes a short logic low pulse at the output of inverter 752. This allows capacitor connected transistor 756 to discharge through switch 731 and transistor 732, thus providing its stored charge to switch 710 via path 735 in addition to the already provided initialization charge thus turning switch 710 ON and allowing capacitor 720 to acquire the input signal.

The size of capacitor connected device 756 may be selected in relation to the size of device 710 in order to establish the desired sampling switch impedance in the sample state. Furthermore, as is known in the art, the physical implementation of device 756 may replicate or ratio the physical implementation of device 710, of its command node 735 and of its associated parasitic circuit elements for an even higher level of impedance control and tracking.

This arrangement allows circuit 700 to compensate for impedance variation associated with an instantaneous gate to source differential. Moreover, because the input signal at node 715 is not loaded down during signal acquisition, (e.g., to drive switch 710) signal distortion during signal sampling is further reduced.

Figure 8:
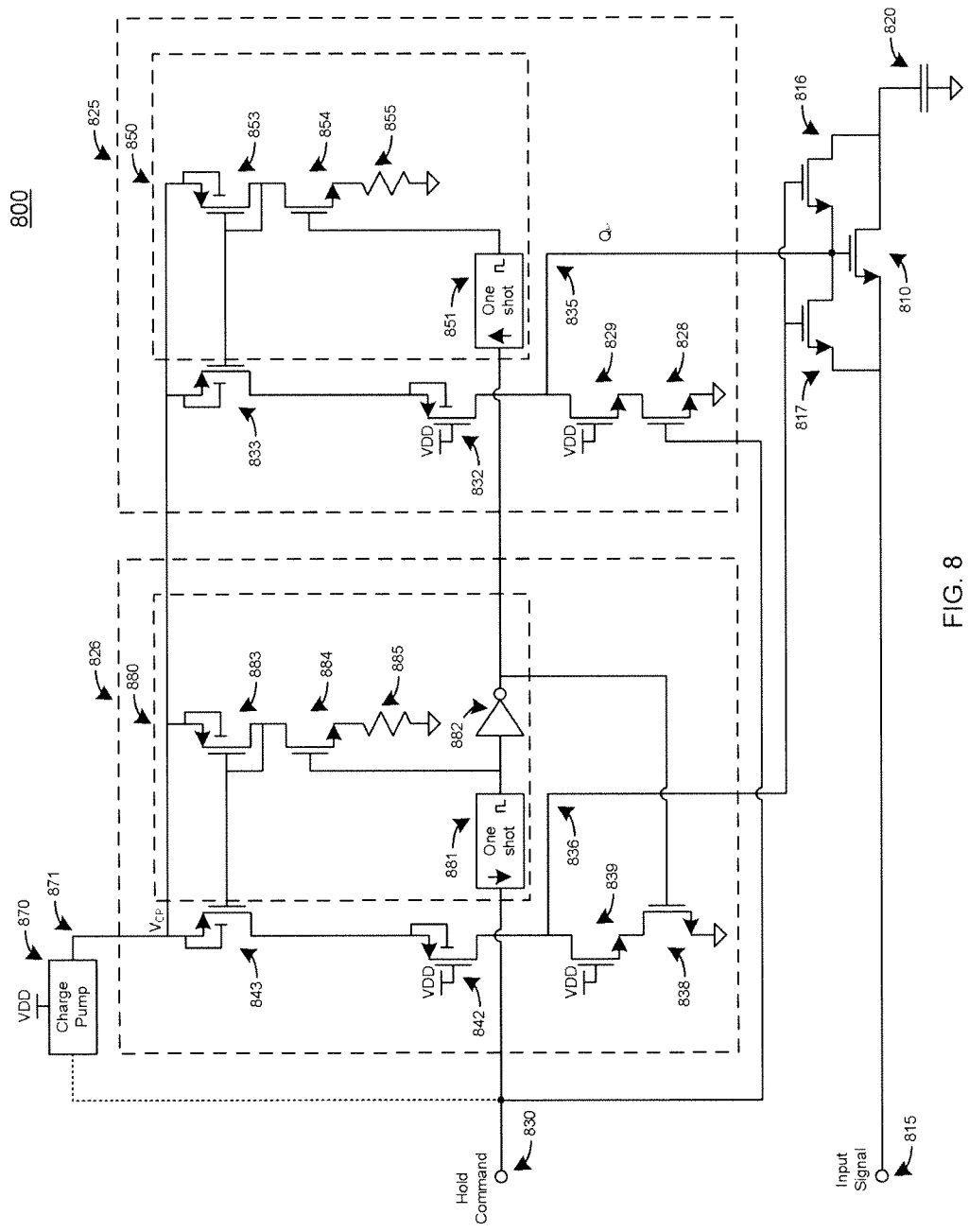
FIG. 8 is a more detailed schematic diagram of another embodiment of a sample and hold circuit constructed in accordance with the principles of the present invention.

Another embodiment of circuit 700 is shown in FIG. 8 as circuit 800. This embodiment generates the desired amount of charge by providing a predetermined current allowed to flow for a predetermined amount of time thus producing a predetermined amount of charge. Circuit 800 is similar in many respects to the circuit described in FIG. 7 and generally includes components and functional blocks which have been numbered similarly to denote similar functionality and general correspondence. For example, circuit 800 includes control circuit 825 (control circuit 725 in FIG. 7), charge generator circuit 850 (charge generator circuit 750 in FIG. 7), initialization control circuit 826 (initialization control circuit 726 in FIG. 7) initialization charge generator circuit 880 (initialization pulse generation circuit 780 in FIG. 7) sampling switch 810 (sampling switch 710 in FIG. 7), gate initialization transistors 816 and 817 (gate initialization transistors 716 and 717 in FIG. 7), sampling capacitor 820 (sampling capacitor 720 in FIG. 7), and charge pump circuit 870 (charge pump circuit 770 in FIG. 7) etc.

As shown, control circuit 825 may include current mirror transistors 833 and 853, and discharge switch 828. Additional devices 829 and 832 limit the voltage across switch 828 and current mirror device 833 respectively and may or may not be included, depending on the operating range of these devices (828 and 833). Charge generator circuit 850 may include a controlled current source comprising MOSFET transistor 854 and resistor 855 and timing circuit 851. The timing circuit 851 is triggered by a low-to-high signal transition at its control input. Initialization control circuit 826 may include current mirror transistors 843 and 883 and discharge switch 838. Additional devices 839 and 842 limit the voltage across switch 838 and current mirror device 843 respectively and may or may not be included, depending on the operating range of these devices (838 and 843). Charge generator circuit 880 may include a controlled current source comprising MOSFET transistor 884 and resistor 885, timing circuit 881 and inverter 882. The timing circuit 881 is triggered by a high-to-low signal transition at its control input. Control circuit 825 and initialization control circuit 826 may operate the same as or similar to circuits 725 and 726 described above.

However, circuit 800 differs from circuit 700 in that charge generator circuit 850 and initialization charge generator circuit 880 deliver charge to transistors 810, 816 and 817 as current pulses of determined duration, rather than as a discharge of stored energy from capacitors. The amount of charge delivered can be defined (using similar considerations as previously discussed in connection with circuit 500 of FIG. 5) by selecting the magnitude of the current provided by the current sources or the width of the pulse generated by the timing circuits or both. As above, circuit 800 may operate in at least two modes, a sample mode and a hold mode.

In operation, a logic high signal may be applied to command node 830. This signal is preferably of sufficient magnitude to turn transistor 828 ON, which discharges control node 835 and the gate of transistor 810, turning switch 810 OFF. This disconnects the input signal at node 815 from capacitor 820, isolating capacitor 820 and placing circuit 800 in a hold state.

The output of one shot circuit 881 in hold mode is a logic low (close to ground), which causes the output of inverter 882 to be a logic high (close to VDD), driving the gate of switch 838 high. This turns transistor 838 ON discharging the gates of initialization transistors 816 and 817 turning them OFF. In hold mode the logic low output of timing circuits 881 and 851 discharge the respective gates of current sources 884 and 854 preventing any charge from being delivered to respectively control terminal 835 and initialization control terminal 836.

When circuit 800 transitions from a hold to a sample state, the HOLD signal at command node 830 may be toggled from logic high to logic low. This turns transistor 828 OFF and triggers the initialization control circuit 826 in an initial part of the sample state. This causes the timing circuit 881 to generate a short logic high pulse (e.g., a relatively short duration logic high signal produced upon detecting a logic high-to-low transition at the trigger input) which causes a short logic low pulse at the output of inverter 882 which turns OFF transistor 838. The logic high pulse at the output of timing circuit 881 turns ON the current source 884 which allows current to flow into the gate of initialization transistors 816 and 817 through current mirror formed by devices 883 and 843. Thus a determined amount of charge is delivered to initialization control terminal 836 turning ON initialization transistors 816 and 817. As a result, the gate of MOSFET 810 is charged to a value tracking the input signal at node 815.

After a predetermined period of time, the output of one-shot 881 returns to a logic low, which turns current source 884 OFF and turns transistor 838 ON (through inverter 882). This discharges the gate of initialization transistors 816 and 817 which turns them OFF, but maintains the initialization charge at the gate of MOSFET 810. The amount of charge delivered to the gate of transistors 816 and 817 is thus dependent on the current generated by transistor 884 in conjunction with resistor 885 and the time constant of one-shot 881, each of which may be selected by circuit designers to ensure the desired ON state impedance for transistors 816 and 817.

Accordingly, at this moment in the signal acquisition process the gate of MOSFET 810 includes the initialization charge which partially or fully offsets any gate to source voltage differential, minimizing (or substantially eliminating) any instantaneous impedance variation, thereby improving the precision of the acquired signal.

At the completion of the initialization circuit 826 operation the output of inverter 882 returns to a logic high state creating a rising edge trigger input for timing circuit 851, prompting the one shot circuit 851 to generate a short logic high pulse (e.g., a relatively short duration logic high signal produced upon detecting a logic low-to-high transition at the trigger input). This pulse turns ON current source comprising transistor 854 and resistor 855 and allows current to flow through the current mirror formed by transistors 853 and 833 into the gate of switch 810 via path 835. This charge, in addition to the already provided initialization charge, turns switch 810 ON allowing capacitor 820 to acquire the input signal.

As above, the amount of charge delivered to the gate of transistor 810 is dependent on the current generated by transistor 854 in conjunction with resistor 855 and the time constant of one-shot 851, each of which may be selected by circuit designers to ensure the desired ON state impedance for transistor 810. Moreover, in some embodiments, the time constant of one-shot 851 (and or one-shot 881) may be selectable by the end-user using known techniques (e.g., by coupling an external network of resistors and/or capacitors). In alternative embodiments, the time constant of one-shot 851 (and/or one-shot 881) may be made to adaptively track semiconductor process parameters and/or environmental parameters (such as temperature, power supply voltage and so on) using known replica and ratio circuit techniques. Furthermore in some embodiments, one shot 881 (and 781 in FIG. 7) may be removed.

Figure 9:
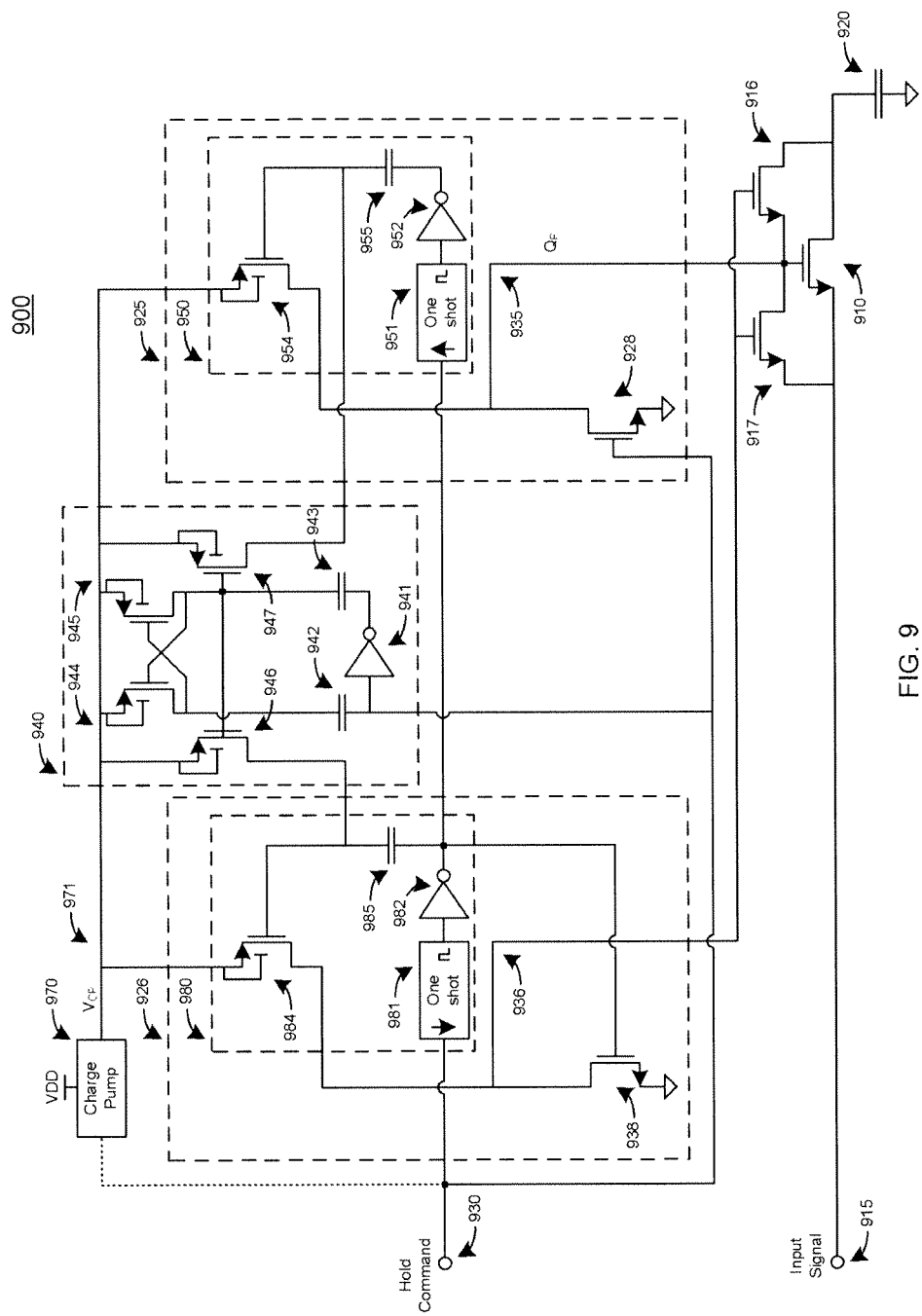
FIG. 9 is a more detailed schematic diagram of another embodiment of a sample and hold circuit constructed in accordance with the principles of the present invention.

Another embodiment of sampling circuit with improved impedance characteristics during sampling is shown in FIG. 9 as circuit 900. Circuit 900 is similar in many respects to the circuit described in FIG. 8 and generally includes components and functional blocks which have been numbered similarly to denote similar functionality and general correspondence. For example, circuit 900 includes control circuit 925 (control circuit 825 in FIG. 8), charge generator circuit 950 (charge generator circuit 850 in FIG. 8), initialization control circuit 926 (initialization control circuit 826 in FIG. 8), initialization charge generator circuit 980 (initialization charge generator circuit 880 in FIG. 8), sampling switch 910 (sampling switch 810 in FIG. 8), gate initialization transistors 916 and 917 (gate initialization transistors 816 and 817 in FIG. 8), capacitor 920 (capacitor 820 in FIG. 8), and charge pump circuit 970 (charge pump circuit 870 in FIG. 8) etc.

As shown, control circuit 925 may include discharge switch 928. Initialization control circuit 926 may include discharge switch 938. Control circuit 925 and initialization control circuit 926 may operate similar to circuits 825 and 826 described above.

Moreover, circuit 900 is similar to circuit 800 in that control circuit 925 and initialization control circuit 926 deliver charge to transistors 910 and respectively 916 and 917 as predetermined current pulses of predetermined time durations. The current value is established by applying a defined voltage across suitably sized MOS transistors while the time duration is determined by trimming circuits. Similar considerations as discussed in relation to circuit 500 apply to the selection of current value and time interval duration. As above, circuit 900 may operate in at least two modes, a sample mode and a hold mode.

Circuit 900 further includes recharge circuit 940 which, during hold mode, restores across level shifting capacitors 955 and 985 a voltage approximately equal with the voltage difference between charge pump output voltage $V_{CP}$ and power supply voltage VDD as will be shown below. Recharge circuit 940 may include inverter 941, level shifting capacitors 942, 943 and transistors 944, 945 and recharge switches 946, 947.

For example, in operation, a logic high signal may be applied to command node 930. This signal is preferably of sufficient magnitude to turn transistor 928 ON, which discharges control path 935 and the gate of MOSFET 910 turning switch 910 OFF. This disconnects the input signal at node 915 from capacitor 920, isolating capacitor 920 and placing circuit 900 in a hold state.

The output of one shot circuit 981 in hold mode is a logic low (close to ground), which causes the output of inverter 982 to be a logic high (close to VDD), driving the gate of switch 938 high. This turns transistor 938 ON discharging the gates of initialization transistors 916 and 917 turning them OFF. In hold mode the logic high output of inverters 982 and 952 discharge the respective gates of current sources 984 and 954 (through respective level shifting capacitors 985 and 955) preventing any charge from being delivered to respectively control terminal 935 and initialization control terminal 936.

During hold state, the input of inverter 941 is at logic level high and its output is at logic level low. These levels, through level shifting capacitors 942 and 943 turn ON transistor 944 and turn OFF transistor 945. Thus the voltage across level shifting capacitor 942 is restored to approximately $V_{CP}$-VDD (because voltage at input of inverter 941 is close to VDD) while the drain of transistor 945 is maintain approximately at a voltage $V_{CP}$-VDD. Therefore recharge switches 946 and 947 are ON. As a consequence, the voltages across level shifting capacitors 985 and 955 are being restored to approximately $V_{CP}$-VDD (because voltage at output of inverters 982 and 952 is close to VDD).

As the HOLD signal toggles from logic high to low, circuit 900 transitions to sample mode, causing input of inverter 941 to be at logic level low while its output is at logic high. These levels, through level shifting capacitors 942 and 943 turn OFF transistor 944 and turn ON transistor 945. Thus the voltage across level shifting capacitor 943 is restored to approximately $V_{CP}$-VDD (because voltage at output of inverter 941 is close to VDD) while the drain of transistor 945 is maintain approximately at voltage $V_{CP}$ and recharge switches 946 and 947 are turned OFF.

When circuit 900 transitions from a hold to a sample state, the HOLD signal at command node 930 may be toggled from logic high to logic low. This turns transistor 928 OFF and triggers the initialization control circuit 926 in an initial part of the sample state. This causes the timing circuit 981 to generate a short logic high pulse (e.g., a relatively short duration logic high signal produced upon detecting a logic high-to-low transition at the trigger input) which causes a short logic low pulse at the output of inverter 982 which turns OFF transistor 938. The logic low pulse at the output of inverter 982 also turns ON the current source 984 through level shifting capacitor 985 which allows current to flow into the gate of initialization transistors 916 and 917 through initialization control node 936. Thus a determined amount of charge is delivered to initialization control terminal 936 turning ON initialization transistors 916 and 917. As a result, the gate of MOSFET 910 is charged to a value tracking the input signal at node 915.

After a predetermined period of time, the output of one-shot 981 returns to logic low thus returning the output of inverter 982 to logic high. Through level shifting capacitor 985, the output of inverter 982 turns current source 984 OFF and turns transistor 938 ON. This discharges the gate of initialization transistors 916 and 917 which turns them OFF, but maintains the initialization charge at the gate of MOSFET 910. The amount of charge delivered to the gate of transistors 916 and 917 is thus dependent on the current generated by transistor 984 when a voltage approximately equal to VDD is applied between its source and gate and the time constant of one-shot 981, each of which may be selected by circuit designers to ensure the desired ON state impedance for transistors 916 and 917.

Accordingly, at this moment in the signal acquisition process the gate of MOSFET 910 includes the initialization charge which partially or fully offsets any gate to source voltage differential, minimizing (or substantially eliminating) any instantaneous impedance variation, thereby improving the precision of the acquired signal.

At the completion of the initialization circuit 926 operation the output of inverter 982 returns to a logic high state creating a rising edge trigger input for timing circuit 951, prompting the one shot circuit 951 to generate a short logic high pulse (e.g., a relatively short duration logic high signal produced upon detecting a logic low-to-high transition at the trigger input) producing a short logic low pulse at output of inverter 952. This pulse turns ON current source transistor 954 through level shifting capacitor 955 and allows current to flow into the gate of switch 910 via path 935. This charge in addition to the already provided initialization charge turns switch 910 ON allowing capacitor 920 to acquire the input signal.

As above, the amount of charge delivered to the gate of transistor 910 is dependent on the current generated by transistor 954 when a voltage approximately equal to VDD is applied between its source and gate and the time constant of one-shot 951, each of which may be selected by circuit designers to ensure the desired ON state impedance for transistor 910. Moreover, in some embodiments, the time constant of one-shot 951 (and/or one-shot 981) may be selectable by the end-user using known techniques (e.g., by coupling an external network of resistors and/or capacitors). In alternative embodiments, the time constant of one-shot 951 (and/or one-shot 981) may be made to adaptively track semiconductor process parameters and/or environmental parameters (such as temperature, power supply voltage and so on) using known replica and ratio circuit techniques. Furthermore in some embodiments, one shot 981 may be removed.

Figure 10:
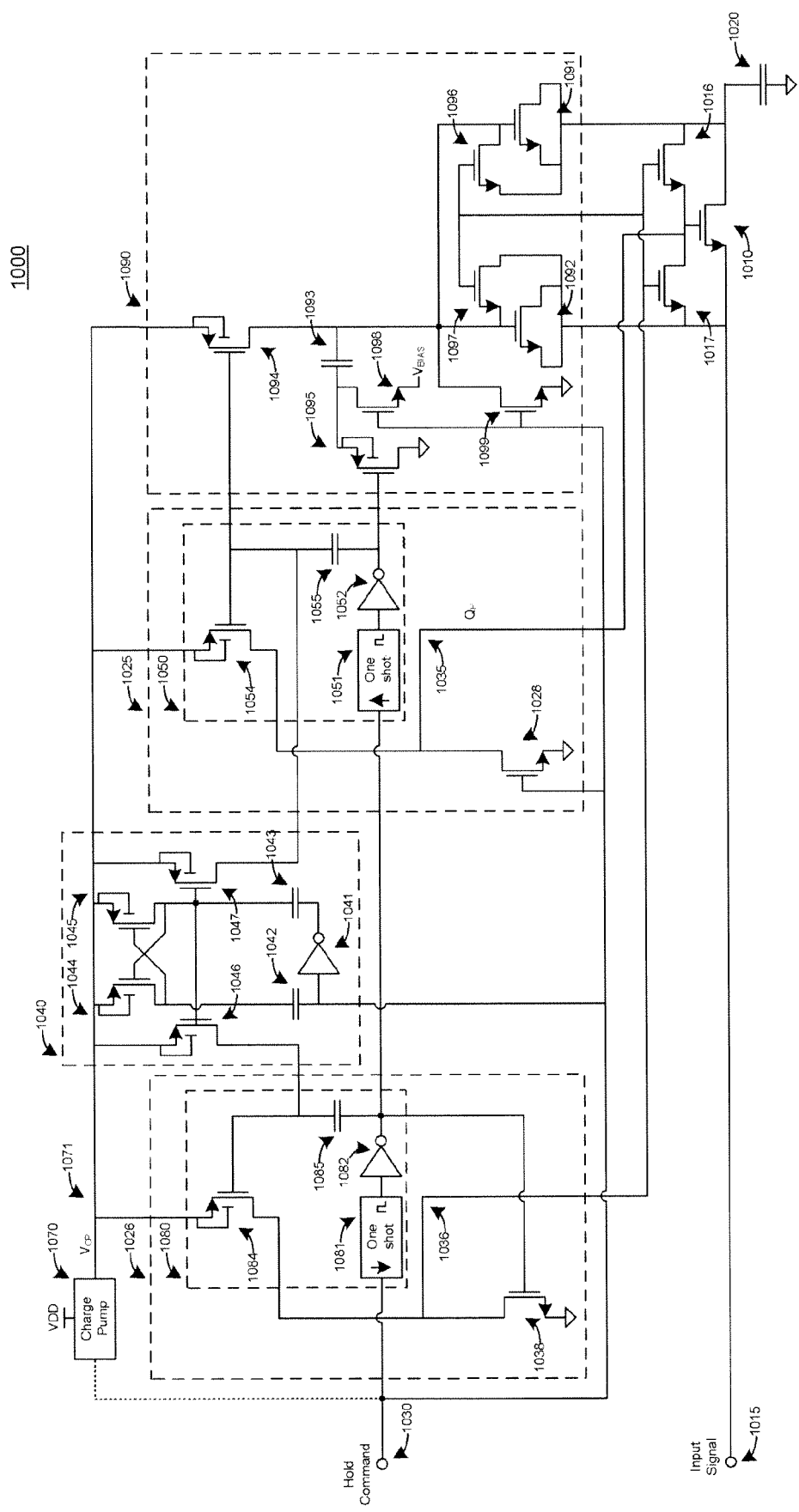
FIG. 10 is a more detailed schematic diagram of another embodiment of a sample and hold circuit constructed in accordance with the principles of the present invention.

The injection of charge into the gate of switch 910 by control circuit 925 (or switch 810 in FIG. 8 or switch 710 in FIG. 7 and so on) which turns switch 910 ON and enables the sampling of the input signal 915 on capacitor 920 also injects a signal dependent amount of charge into this signal path. The consequence is a very small, input signal dependent, disturbance which nevertheless, in very high linearity applications, translates into noticeable nonlinearity. It is thus desirable to introduce circuits able to reduce or substantially eliminate this effect. As an example the sampling circuit 900 can be modified as shown in FIG. 10 to construct circuit 1000.

Circuit 1000 is similar in many respects to the circuit described in FIG. 9 and generally includes components and functional blocks which have been numbered similarly to denote similar functionality and general correspondence. For example, circuit 1000 includes control circuit 1025 (control circuit 925 in FIG. 9), charge generator circuit 1050 (charge generator circuit 950 in FIG. 9), initialization control circuit 1026 (initialization control circuit 926 in FIG. 9), initialization charge generator circuit 1080 (initialization charge generator circuit 980 in FIG. 9), recharge circuit 1040 (recharge circuit 940 in FIG. 9), sampling switch 1010 (sampling switch 910 in FIG. 9), gate initialization transistors 1016 and 1017 (gate initialization transistors 916 and 917 in FIG. 9), capacitor 1020 (capacitor 920 in FIG. 9), and charge pump circuit 1070 (charge pump circuit 970 in FIG. 9) etc.

As shown, control circuit 1025 may include discharge switch 1028. Initialization control circuit 1026 may include discharge switch 1038. Control circuit 1025, initialization control circuit 1026 and recharge circuit 1040 may operate similar to circuits 925, 926 and 940 described above.

Furthermore, circuit 1000 includes correction circuit 1090 which, operating in conjunction with control circuit 1025 and initialization control circuit 1026, substantially eliminates the variation with input signal of the charge injected into the signal path when main switch 1010 is turned ON. Correction circuit 1090 includes capacitor connected devices 1091 and 1092 used to inject a correction charge into the signal path on both sides of main switch 1010. The gate to source voltage across these devices (1091 and 1092) is set by initialization transistors 1096 and 1097 respectively. The correction charge is produced by current source 1094 turned ON as directed by timing circuit 1051 and shaped by square law device 1095 (i.e. a device for which the current flowing through it varies approximately as the square of the control voltage applied to its gate) in conjunction with coupling capacitor 1093. During hold state, reset device 1098 applies to the body and source terminals of device 1095 a bias voltage $V_{bias}$ selected such as to maintain device 1095 close to its turn-on threshold. In addition, during hold state, device 1099 discharges the gates of capacitive connected transistors 1091 and 1092 turning them OFF. As above, circuit 1000 may operate in at least two modes, a sample mode and a hold mode.

For example, in operation, a logic high signal may be applied to command node 1030. This signal is preferably of sufficient magnitude to turn transistors 1028, 1099 and 1098 ON. Transistor 1028 discharges control path 1035 and the gate of MOSFET 1010 turning switch 1010 OFF. This disconnects the input signal at node 1015 from capacitor 1020, isolating capacitor 1020 and placing circuit 1000 in a hold state. Transistor 1099 discharges the gates of transistors 1091 and 1092 turning them OFF. Transistor 1098 maintains the body and source potentials of device 1095 close to $V_{bias}$ and in conjunction with discharge transistor 1099 sets the voltage across coupling capacitor 1093.

The output of one shot circuit 1081 in hold mode is a logic low (close to ground), which causes the output of inverter 1082 to be a logic high (close to VDD), driving the gate of switch 1038 high. This turns transistor 1038 ON discharging the gates of initialization transistors 1016, 1017, 1096 and 1097 turning them OFF. In hold mode the logic high output of inverters 1082 and 1052 discharge the respective gates of current sources 1084 and 1054 (through respective level shifting capacitors 1085 and 1055) preventing any charge from being delivered to respectively control terminal 1035 and initialization control terminal 1036. Furthermore the output of inverter 1052 is at logic level high maintaining in an OFF state the correction shaping square law device 1095.

During hold state, the input of inverter 1041 is at logic level high and its output is at logic level low. These levels, through level shifting capacitors 1042 and 1043 turn ON transistor 1044 and turn OFF transistor 1045. Thus the voltage across level shifting capacitor 1042 is restored to approximately $V_{CP}$–VDD (because voltage at input of inverter 1041 is close to VDD) while the drain of transistor 1045 is maintain approximately at a voltage $V_{CP}$–VDD. Therefore recharge switches 1046 and 1047 are ON. As a consequence, the voltages across level shifting capacitors 1085 and 1055 are being restored to approximately $V_{CP}$–VDD (because voltage at output of inverters 1082 and 1052 is close to VDD).

As the HOLD signal toggles from logic high to low, circuit 1000 transitions to sample mode, causing input of inverter 1041 to be at logic level low while its output is at logic high. These levels, through level shifting capacitors 1042 and 1043 turn OFF transistor 1044 and turn ON transistor 1045. Thus the voltage across level shifting capacitor 1043 is restored to approximately $V_{CP}$–VDD (because voltage at output of inverter 1041 is close to VDD) while the drain of transistor 1045 is maintain approximately at voltage $V_{CP}$ and recharge switches 1046 and 1047 are turned OFF.

When circuit 1000 transitions from a hold to a sample state, the HOLD signal at command node 1030 may be toggled from logic high to logic low. This drives OFF reset device 1098, turns discharge transistors 1028 and 1099 OFF and triggers the initialization control circuit 1026 in an initial part of the sample state. This causes the timing circuit 1081 to generate a short logic high pulse (e.g., a relatively short duration logic high signal produced upon detecting a logic high-to-low transition at the trigger input) which causes a short logic low pulse at the output of inverter 1082 which turns OFF transistor 1038. The logic low pulse at the output of inverter 1082 also turns ON the current source 1084 through level shifting capacitor 1085 which allows current to flow into the gate of initialization transistors 1016, 1017, 1096 and 1097 through initialization control node 1036. Thus a determined amount of charge is delivered to initialization control terminal 1036 turning ON initialization transistors 1016, 1017, 1096 and 1097. As a result, the gates of main switch 1010 and of capacitive connected devices 1091 and 1092 are charged to a value tracking the input signal present at node 1015.

After a predetermined period of time, the output of one-shot 1081 returns to logic low thus returning the output of inverter 1082 to logic high. Through level shifting capacitor 1085, the output of inverter 1082 turns current source 1084 OFF and turns transistor 1038 ON. This discharges the gate of initialization transistors 1016, 1017, 1096 and 1097 and turns them OFF, but maintains the initialization charge at the gate of MOSFET 1010 and at the gates of capacitive connected transistors 1091 and 1092. The amount of charge delivered to the gate of transistors 1016, 1017, 1096 and 1097 is thus dependent on the current generated by transistor 1084 when a voltage approximately equal to VDD is applied between its source and gate and the time constant of one-shot 1081, each of which may be selected by circuit designers to ensure the desired ON state impedance for transistors 1016, 1017, 1096 and 1097.

Accordingly, at this moment in the signal acquisition process the gate of MOSFET 1010 includes the initialization charge which partially or fully offsets any gate to source voltage differential, minimizing (or substantially eliminating) any instantaneous impedance variation, thereby improving the precision of the acquired signal.

At the completion of the initialization circuit 1026 operation the output of inverter 1082 returns to a logic high state creating a rising edge trigger input for timing circuit 1051, prompting the one shot circuit 1051 to generate a short logic high pulse (e.g., a relatively short duration logic high signal produced upon detecting a logic low-to-high transition at the trigger input) producing a short logic low pulse at output of inverter 1052. This pulse brings the gate of square law device 1095 close to ground and concomitantly turns ON parallel connected current source transistors 1054 and 1094 through level shifting capacitor 1055. Thus it allows current to flow respectively into the gate of switch 1010 via path 1035, into the correction shaping square law device 1095 through coupling capacitor 1093 and into the gates of correction injection capacitive connected devices 1091 and 1092. The charge flowing via path 1035 is added to the already provided initialization charge turning switch 1010 ON and allowing capacitor 1020 to acquire the input signal. The correction charge injected through capacitive connected devices 1091 and 1092 into the signal path established between input terminal 1015 and sampling capacitor 1020 is shaped by the square law device 1095 (which has its gate maintained near ground during this time) in conjunction with the previously set voltage across coupling capacitor 1093.

As above, the amount of charge delivered to the gate of transistor 1010 is dependent on the current generated by transistor 1054 when a voltage approximately equal to VDD is applied between its source and gate and the time constant of one-shot 1051, each of which may be selected by circuit designers to ensure the desired ON state impedance for transistor 1010.

Similarly, the amount of charge injected into the signal path by circuit 1090 is dependent on the current generated by transistor 1094 when a voltage approximately equal to VDD is applied between its source and gate, by the size of the capacitive coupled devices 1091 and 1092 and by the time constant of one-shot 1051, each of which may be selected by circuit designers for the desired degree of correction. The degree of cancellation of the signal dependent charge injection is further adjusted by selecting the size of coupling capacitor 1093 and the characteristics of square law device 1095.

Moreover, in some embodiments, the time constant of one-shot 1051 (and or one-shot 1081) may be selectable by the end-user using known techniques (e.g., by coupling an external network of resistors and/or capacitors). In alternative embodiments, the time constant of one-shot 1051 (and/or one-shot 1081) may be made to adaptively track semiconductor process parameters and/or environmental parameters (such as temperature, power supply voltage and so on) using known replica and ratio circuit techniques. Furthermore in some embodiments, one shot 1081 may be removed.

Circuit 1000 in FIG. 10 illustrates compensation circuit 1090 used in conjunction with a sampling system implementation similar to circuit 900 of FIG. 9. One skilled in the art will recognize that this compensation solution can be similarly used in conjunction with other sampling system implementations (e.g. circuit 700 in FIG. 7, circuit 800 in FIG. 8, etc) in order to substantially reduce or eliminate signal dependent charge injection into the signal path when the circuit transitions from hold state to sample state.

While these circuits greatly improve the sampling system performance there remains a small but not negligible source of signal dependent distortions in the body bias changes experienced by the main sampling switch. As an example, referring to FIG. 6, the body of main sampling switch (MOSFET 610) is implicitly connected to ground potential. As the input signal at terminal 615 varies so do the source-to-body and drain-to-body potentials of MOSFET 610. While the charge driven sampling systems described above mitigate to a great extent the resulting threshold voltage changes, the variations with input signal of MOSFET 610 characteristics (e.g. variations in source and drain to body capacitance and so on) continue to translate into signal dependent distortions.

These signal distortions can be substantially eliminated if a relatively constant voltage difference can be maintained between the main sampling switch body and its source or drain terminal. A further advantage may be obtained if the constant body bias voltage is maintain during both sample and hold states thus avoiding undesirable charge injection and particularly undesirable input signal dependent charge injection.

Such an approach may be considered when the body terminal of the main sampling switch can be independently controlled (e.g. the main sampling switch is constructed into an isolated well). For clarity, this discussion is exemplified using an re-channel MOSFET device as the main sampling switch but one skilled in the art will recognize that these considerations can be directly extended for the entire range of field effect devices.

Figure 11:
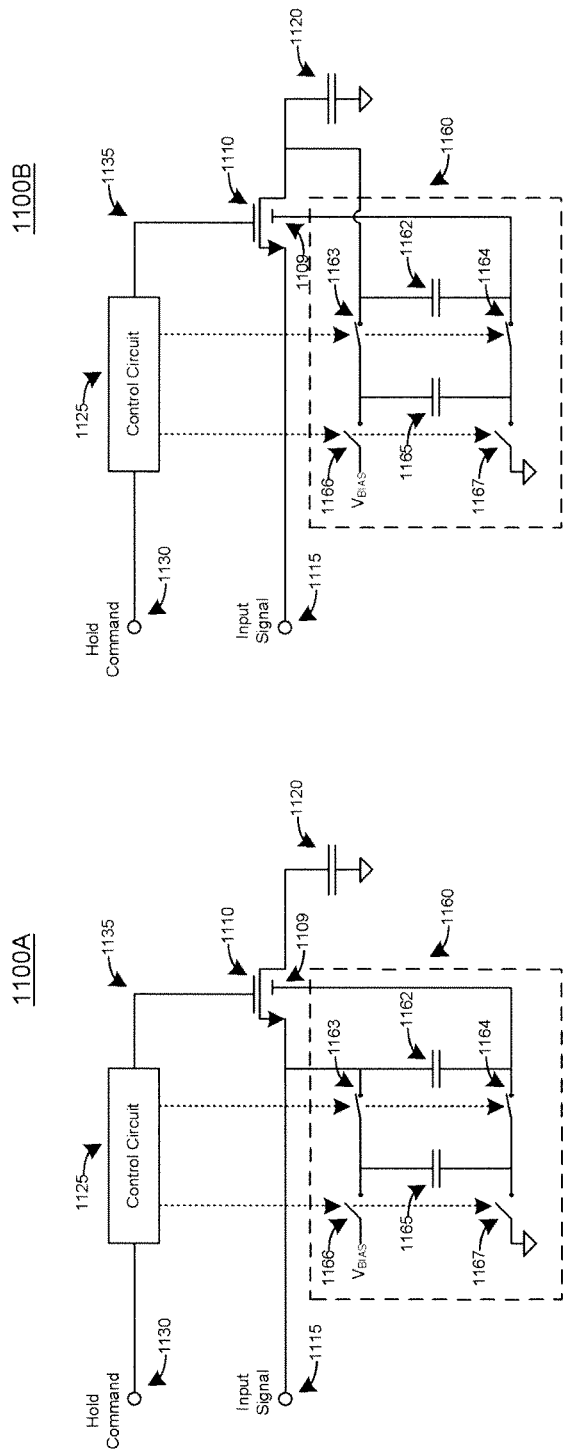
FIG. 11 is a generalized schematic diagram of another embodiment of a sample and hold circuit constructed in accordance with the principles of the present invention.

A generalized schematic illustrating this approach is shown in FIG. 11 as circuits 1100A and 1100B. Circuits 1100A and 1100B are similar in many respects to the circuit 400 described in FIG. 4 and generally include components and functional blocks which have been numbered similarly to denote similar functionality and general correspondence. For example, circuits 1100A and 1100B include control circuit 1125 (control circuit 425 in FIG. 4), sampling switch 1110 (sampling switch 410 in FIG. 4), capacitor 1120 (capacitor 420 in FIG. 4), etc.

Sampling switch 1110 is illustrated as an n-channel MOSFET device with an explicitly available body terminal 1109. Circuits 1100A and 1100B further include body bias circuit 1160 which maintains a substantially constant bias voltage on the body terminal of switch 1110 with respect to its source or drain terminal. This bias voltage should be chosen to ensure that, for the entire expected input signal range, both source and drain junctions of transistor 1110 remain correctly biased. The bias voltage is maintained across bias capacitor 1162 which may represents the intrinsic body capacitance associated with device 1110 or, if this is insufficient in specific applications, may be constructed from the body capacitance of transistor 1110 in parallel with additional explicit capacitance.

Over time the voltage across bias capacitor 1162 must be refreshed and this is accomplished by refresh capacitor 1165 and switches 1163, 1164, 1166 and 1167 operating in a two phase refresh cycle. In a first phase switches 1163 and 1164 are opened while switches 1166 and 1167 are closed and voltage $V_{BIAS}$ is applied across capacitor 1165. In a second phase switches 1166 and 1167 are opened while switches 1163 and 1164 are closed and capacitor 1165 is connected in parallel with capacitor 1162. The signals controlling switch pairs 1163, 1164 and 1166, 1167 should maintain a non-overlapping timing relation such that switch pair 1166, 1167 turns ON only after switch pair 1163, 1164 has turned OFF and similarly switch pair 1163, 1164 turns ON only after switch pair 1166, 1167 has turned OFF. After a sufficiently long start-up sequence composed of successive refresh cycles the voltage across bias capacitor 1162 will approximate reach bias voltage $V_{BIAS}$ and remain substantially constant thereafter.

It is beneficial for the first and second phase of the refresh cycle to be synchronized with the sample and hold states of the sampling system in order to minimize the charge which may be injected in the signal path (input terminal and/or sampling capacitor) by switches 1163 and 1164. The control signal for switch pair 1163, 1164 should be properly aligned with respect to the transition of the sampling system from sample state to hold state. This timing relation is indicated by the dashed lines controlling switch pairs 1163, 1164 and 1166, 1967 originating with the control circuit 1125. For example these control signals can be derived directly from the hold signal using well known logic, timing and delay circuits as will be shown below. In one possible implementation the first phase may occur during the hold state and the second phase may occur during the sample state.

While very similar, circuits 1100A and 1100B have nevertheless specific advantages and disadvantages. In circuit 1100A, the potential charge injected by switch pair 1163, 1164 is less of a concerned as it flows into the relatively low impedance input terminal. This places a less stringent demand upon the timing relation between switches 1163, 1164 control signal and sampling switch control signal applied to node 1135. As it will be shown below, these control signals can be simultaneous. In the same time, in circuit 1100A the body terminal 1109 experiences a voltage variation which closely follows the signal applied to input terminal 1115. During a hold state this signal may partially leak into the sampling capacitor 1120 through diffusion capacitance associated with sampling switch 1110, resulting in undesirable errors.

In circuit 1100B, the voltage on body terminal 1109 is substantially fixed during hold state avoiding any significant charge redistribution through diffusion capacitance. In the same time charge injected by switch pair 1163, 1164 flows into the sampling capacitor and as such, during hold state, may corrupt the acquired sample. It is thus desirable to allow sufficient settling time from the moment the control signal for switch pair 1163, 1164 transitions to the moment the sampling system enters hold state.

Persons skilled in the art will recognize that the constant body bias solutions described in FIG. 11 may be beneficially implemented in conjunction with such novel sampling system embodiments as shown in FIG. 5 through FIG. 10 as well as with other known sampling configurations.

In implementations such as shown in FIG. 5 through FIG. 10, during the sampling system transition between sample and hold states, the gate terminal of the main sampling switch sees a voltage swing approximately tracking the input signal. This voltage transition, when flowing through intrinsic capacitance inherently present between the main sampling switch gate terminal and the signal path, may impart distortions to the signal acquired by the sampling system. As previously mentioned, this variation may also translate into sampling jitter further distorting the result of the sampling operation. It is thus desirable to substantially reduce or eliminate the input signal related variation in the voltage swing applied at the gate of the main sampling switch.

The circuits shown in FIG. 7 through FIG. 10 attempt to mitigate this effect through the use of an initialization step in which the gate of the main sampling switch is initially biased at a level tracking the input signal. The body bias circuits described in FIG. 11 provide an opportunity for an improved configuration. During hold state, in order to decouple the input terminal from the sampling capacitor, the gate of main sampling switch may be discharged to a potential approximating its body potential (rather than a fixed ground potential as in FIG. 5 through FIG. 10). Thus, preferably using a body bias solution as shown by circuit 1100A, the voltage swing on the gate of the main sampling switch is made substantially independent of input signal.

Figure 12:
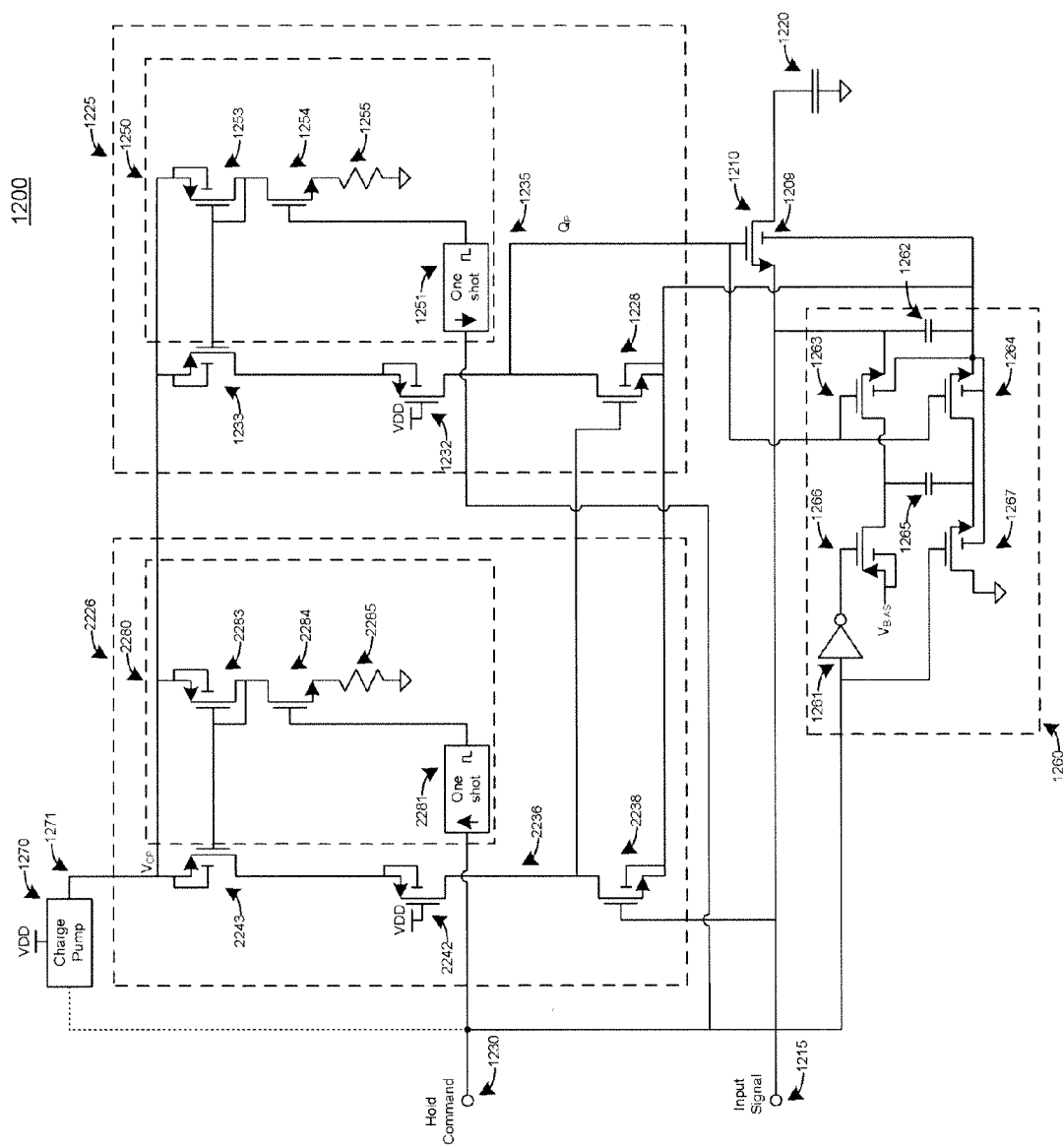
FIG. 12 is a more detailed schematic diagram of another embodiment of a sample and hold circuit constructed in accordance with the principles of the present invention.

Referring now to FIG. 12, a possible specific implementation 1200, constructed in accordance with the principles of the present invention, is shown. Circuit 1200 generally includes components and functional blocks similar the ones already described above which have been numbered similarly to denote similar functionality and general correspondence. For example, circuit 1200 includes input node 1215, command node 1230, control node 1235, sampling switch 1210, sampling capacitor 1220, control circuit 1225, charge pump circuit 1270, charge pump voltage rail 1271 and body bias circuit 1260, etc.

As shown, control circuit 1225 may include current mirror transistors 1233 and 1253 and discharge switch 1228. Additional device 1232 limits the voltage across current mirror device 1233 and may or may not be included, depending on the operating range of device 1233. Charge generator circuit 1250 may include a controlled current source comprising MOSFET transistor 1254 and resistor 1255 and timing circuit 1251. The timing circuit 1251 is triggered by a high-to-low signal transition at its control input. As previously described, signal distortions are further reduced by substantially reducing or eliminating the input signal dependency for the voltage swing applied to sampling switch control node 1235. This is achieved by discharging control terminal 1235 to switch body terminal 1209 through discharge switch 1228.

Circuit 1200 may further comprise discharge control circuit 2226 which may include current mirror transistors 2243 and 2283 and discharge switch 2238. Additional device 2242 limits the voltage across current mirror device 2243 and may or may not be included, depending on the operating range of device 2243. Discharge control charge generator circuit 2280 may include a controlled current source comprising MOSFET transistor 2284 and resistor 2285 and timing circuit 2281. The timing circuit 2281 is triggered by a low-to-high signal transition at its control input.

Circuit 1200, similar to circuit 1100A shown in FIG. 10, may also includes body bias circuit 1260 coupled between sampling switch body terminal 1209 and sampling system input terminal 1215. Circuit 1260 may consist of capacitance 1262, refresh capacitor 1265, refresh switches 1263, 1264, 1266 and 1267 and logic inverter 1261.

Charge pump circuit 1270 may or may not be included depending upon the availability of a supply voltage $V_{CP}$ which itself may be determined by specific implementation details (e.g. the expected input signal range, the electrical parameters of sampling switch 1210 and so on). Similarly to previously discussed circuits, the operation of charge pump circuit 1270 may or may not be synchronized with (or even directly controlled by) the hold signal present at command node 1230.

As above, circuit 1200 operates in at least two modes, a sample mode and a hold mode and may operate as follows. A logic high signal may be applied to the input of command node 1230. This signal is preferably of sufficient magnitude to directly turn transistor 1267 ON and, through inverter 1261, turn transistor 1266 also ON. Thus the body bias circuit 1260, operating in the first phase of the refresh cycle, establishes on capacitor 1265 a voltage approximately equal to $V_{BIAS}$, selected to ensure proper bias conditions for sampling switch 1210 over the entire range of the input signal.

Upon entering the hold state, effected by a low-to-high transition applied at the command terminal 1230, discharge control circuit 2226 is triggered and it provides a defined amount of charge to the gate of discharge switch 1228 turning it ON. This allows the gates of main sampling switch 1210 and of refresh switch pair 1263, 1264 to be discharged to the level of the main sampling switch body terminal 1209. Thus MOSFET 1210 turns OFF and disconnects the input signal at node 1215 from capacitor 1220, isolating capacitor 1220 and placing circuit 1200 in a hold state. Simultaneously, switch pair 1263, 1264 turns off isolating bias capacitance 1262 from refresh capacitor 1265. It is desirable for switch pair 1263, 1264 to turn OFF before devices 1266 and 1267 turn ON. This may be accomplished by delays implicitly present in a physical implementation (and not explicitly indicated in FIG. 12) and, if necessary, by the introduction of well known timing delay devices (e.g. RC circuits, logic pass-through gates, etc) in the control path of devices 1265 and 1266.

A low-to-high transition at command node 1230 triggers, at the beginning of the hold state, causes the timing circuit 2281 to generate a short logic high pulse (e.g., a relatively short duration logic high signal produced upon detecting a logic low-to-high transition at the trigger input) which turns ON current source comprising transistor 2284 and resistor 2285 and allows current to flow into the gate of discharge transistor 1228 through current mirror formed by devices 2283 and 2243. After a predetermined period of time, the output of one-shot 2281 returns to logic low and turns current source 2284 OFF. Thus a determined amount of charge defined by the current source device 2284 in conjunction with resistor 2285 and by the time constant of one-shot circuit 2281 is delivered to the gate of device 1228. Each one of these elements may be selected by circuit designers to ensure the desired ON state impedance for transistor 1228 and therefore ensure an adequately fast turn-of for main sampling switch 1210 and for refresh switch pair 1263, 1264.

Device 2238 is selected such that, when a voltage approximately equal to $V_{BIAS}$ is applied between its gate and source terminals, it allows the charge provided by the discharge control charge generator circuit 2280 to turn ON transistor 1228 and adequately discharge control node 1235. In the same time, device 2238 should be able to remove the just injected charge from the gate of device 1228 before the end of hold state.

To transition from a hold to a sample state, the HOLD signal at command node 1230 may be toggled from logic high to a logic low. This turn OFF transistor 1267 directly and, through inverter 1261, transistor 1266. It also causes timing circuit 1251 to generate a short logic high pulse (e.g., a relatively short duration logic high signal produced upon detecting a logic high-to-low transition at the trigger input). This pulse turns ON current source comprising transistor 1254 and resistor 1255 and allows current to flow through the current mirror formed by transistors 1253 and 1233 into the gate of switch 1210 via path 1235. This charge turns switch 1210 ON allowing capacitor 1220 to acquire the input signal.

A defined amount of charge also flows into the gate of refresh switch pair 1263, 1264 turning them ON and coupling refresh capacitor 1265 to bias capacitance 1262.

As above, the amount of charge delivered to the gate of transistors 1210, 1263 and 1264 is dependent on the current generated by transistor 1254 in conjunction with resistor 1255 and the time constant of one-shot 1251, each of which may be selected by circuit designers to ensure the desired ON state impedance for transistor 1210 and refresh switch pair 1263, 1264. Moreover, in some embodiments, the time constant of one-shot 1251 (and or one-shot 2281) may be selectable by the end-user using known techniques (e.g., by coupling an external network of resistors and/or capacitors). In alternative embodiments, the time constant of one-shot 1251 (and/or one-shot 2281) may be made to adaptively track semiconductor process parameters and/or environmental parameters (such as temperature, power supply voltage and so on) using known replica and ratio circuit techniques.

Circuit 1200 generates the predefined charge used to control sampling switch 1210, refresh switch pair 1263, 1264 and discharge switch 1228 using timing circuits (1251 and 2281) and resistive based current sources (1254, 1255 and 2284, 2285) flowing through current mirrors (1253, 1233 and 2283, 2243). Persons skilled in the art will recognize that, depending on specific applications, other charge generation solutions may be used as for example but not limited to the ones employed in circuits 600 and 900.

Although preferred embodiments of the present invention have been disclosed with various circuits connected to other circuits, persons skilled in the art will appreciate that it may not be necessary for such connections to be direct and additional circuits may be interconnected between the shown connected circuits without departing from the spirit of the invention as shown. Persons skilled in the art also will appreciate that the present invention can be practiced by other than the specifically described embodiments. The described embodiments are presented for purposes of illustration and not of limitation, and the present invention is limited only by the claims which follow.

What is claimed is:

1. A sampling circuit that operates in at least a sample state and a hold state comprising:
   a semiconductor switch that operates in at least a non-conductive mode and a conductive mode as directed by an amount of charge applied to a control terminal, the semiconductor switch being coupled between a source of an input signal and an output terminal;
   an initialization circuit that is operative to selectively couple an initialization signal at least partially representative of the input signal to the control terminal, during an initialization state;
   a charge generator for producing a charge that is distinct from the input signal and coupled to the control terminal to control the switch; and
   a control circuit that is operative to selectively direct the charge generator to deliver a predetermined amount of charge to the control terminal such that the impedance of the semiconductor switch during a sample state is maintained substantially constant.

2. The sampling circuit of claim 1, wherein the initialization circuit is coupled to receive the input signal.

3. The sampling circuit of claim 2, wherein the initialization circuit charge is at least partially provided by the input signal.

4. The sampling circuit of claim 1, wherein the initialization circuit is activated when the semiconductor switch is in a non-conductive mode.

5. The sampling circuit of claim 1, wherein the initialization circuit is inactive when the semiconductor switch is in a conductive mode.

6. The sampling circuit of claim 1, further comprising an initialization controller that includes a discharge switch operative to deactivate the initialization circuit.

7. The sampling circuit of claim 1, wherein the initialization circuit includes at least one semiconductor initialization switch coupled between the input signal source and the control terminal.

8. The sampling circuit of claim 1, further comprising an initialization controller that comprises an initialization charge generator operative to activate the initialization circuit.

9. The sampling circuit of claim 8 wherein the initialization charge generator is coupled to a voltage multiplier circuit.

10. The sampling circuit of claim 9, wherein the voltage multiplier is a charge pump.

11. The sampling circuit of claim 8, wherein the initialization charge generator includes a pulse generation circuit responsive to a control signal.

12. The sampling circuit of claim 8, wherein the initialization charge generator includes a current source responsive to a control signal.

13. The sampling circuit of claim 8, wherein the initialization charge generator includes at least one initialization capacitor and one initialization charge sourcing switch.

14. The sampling circuit of claim 13, wherein the initialization capacitor is a capacitor connected semiconductor device.

15. The sampling circuit of claim 1, wherein the initialization circuit is configured to provide a first switchable coupling between the source of the input signal and the control terminal of the semiconductor switch and a second switchable coupling between the output terminal and the control terminal of the semiconductor switch.

16. A method of transitioning a semiconductor switch from a high impedance, substantially non-conductive state to a low impedance, substantially conductive state, the semiconductor switch being coupled between a source of an input signal and an output terminal, the method comprising:
   determining a capacitance associated with the semiconductor switch control terminal when the semiconductor switch, in its conductive state, reaches a desired impedance value;
   determining an amount of charge absorbed by the semiconductor switch control terminal capacitance when the semiconductor switch, in its conductive state, reaches a desired impedance value; and
   providing a charge to a control terminal of the semiconductor switch which is substantially equal to or greater than the amount of charge absorbed by the gate to channel capacitance, such that the semiconductor switch turns ON, and an impedance of the semiconductor switch is maintained substantially constant.

17. The method of claim 16, wherein the providing step further comprises charging at least one capacitor to a value which is substantially equal to or greater than the amount of charge absorbed by the semiconductor switch control terminal capacitance when the semiconductor switch, in its conductive state, reaches a desired impedance value.

18. The method of claim 17, wherein the providing step further comprises coupling the charge of the at least one capacitor to the control terminal of the semiconductor switch and discharging the capacitor to turn the semiconductor switch ON.

19. The method of claim 18, wherein the providing step further comprises discharging the at least one capacitor in response to a control signal.

20. The method of claim 18, wherein the providing step further comprises maintaining energy discharged by the at least one capacitor on the control terminal to maintain the semiconductor switch ON.

21. The method of claim 16, wherein the providing step further comprises providing a charge to the control terminal of the semiconductor switch which is substantially equal to or greater than the amount of charge absorbed by the gate to channel capacitance and any parasitic capacitance encountered in a transmission path and the control terminal.

22. The method of claim 18, wherein the providing step further comprises coupling a current source to the control terminal of the semiconductor switch in response to a timing circuit.

23. The method of claim 16, further comprising turning the semiconductor switch OFF by discharging the control terminal.

24. The method of claim 16, wherein the step of providing a charge comprises coupling to the control terminal an initialization signal at least partially representative of the input signal.

* * * * *